(12) United States Patent
Goutain et al.

(10) Patent No.: US 9,025,635 B2
(45) Date of Patent: May 5, 2015

(54) LASER PACKAGE HAVING MULTIPLE EMITTERS CONFIGURED ON A SUPPORT MEMBER

(71) Applicant: Soraa, Inc., Fremont, CA (US)

(72) Inventors: Eric Goutain, Fremont, CA (US); James W. Raring, Fremont, CA (US); Paul Rudy, Fremont, CA (US); Hua Huang, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 73 days.

(21) Appl. No.: 13/732,233

(22) Filed: Dec. 31, 2012

(65) Prior Publication Data

US 2014/0086539 A1    Mar. 27, 2014

Related U.S. Application Data

(63) Continuation-in-part of application No. 13/356,355, filed on Jan. 23, 2012.

(60) Provisional application No. 61/435,578, filed on Jan. 24, 2011.

(51) Int. Cl.
*H01S 5/22*  (2006.01)
*G02B 6/27*  (2006.01)
(Continued)

(52) U.S. Cl.
CPC . *G02B 6/27* (2013.01); *H01S 5/005* (2013.01); *H01S 5/02252* (2013.01); *H01S 5/02284* (2013.01); *H01S 5/02292* (2013.01); *H01S 5/02476* (2013.01); *H01S 5/0287* (2013.01);
(Continued)

(58) Field of Classification Search
CPC ... H01S 5/34333; H01S 5/4031; H01S 5/005; H01S 5/02252; H01S 5/02284; H01S 5/02292; H01S 5/02476; H01S 5/0287; H01S 5/2009; H01S 5/2201; H01S 5/3202; H01S 5/3211; H01S 5/4012; H01S 5/4056; H01S 2301/14; H01S 2304/04
USPC ........................................................ 372/50.12
See application file for complete search history.

(56) References Cited

U.S. PATENT DOCUMENTS 4,318,058 A   3/1982   Mito et al.
4,341,592 A   7/1982   Shortes et al.
(Continued)

FOREIGN PATENT DOCUMENTS

CN        101009347       3/1987
CN        1538534         10/2004
(Continued)

OTHER PUBLICATIONS

USPTO Notice of Allowance for U.S. Appl. No. 13/853,694 dated Sep. 3, 2013, 8 pages.
(Continued)

*Primary Examiner* — Xinning Niu
(74) *Attorney, Agent, or Firm* — Kilpatrick Townsend & Stockton LLP

(57) ABSTRACT

A method and device for emitting electromagnetic radiation at high power using nonpolar or semipolar gallium containing substrates such as GaN, AlN, InN, InGaN, AlGaN, and AlInGaN, is provided. In various embodiments, the laser device includes plural laser emitters emitting green or blue laser light, integrated a substrate.

43 Claims, 17 Drawing Sheets

(51) Int. Cl.
*H01S 5/343* (2006.01)
*B82Y 20/00* (2011.01)
*G02B 6/42* (2006.01)
*H01S 5/00* (2006.01)
*H01S 5/022* (2006.01)
*H01S 5/024* (2006.01)
*H01S 5/028* (2006.01)
*H01S 5/40* (2006.01)
*H01S 5/042* (2006.01)

(52) U.S. Cl.
CPC .......... *H01S 5/2201* (2013.01); *H01S 5/34333* (2013.01); *H01S 5/4012* (2013.01); *H01S 5/4031* (2013.01); *H01S 5/4056* (2013.01); *H01S 2301/14* (2013.01); *H01S 2304/04* (2013.01); *H01S 5/0021* (2013.01); *H01S 5/02208* (2013.01); *H01S 5/02276* (2013.01); *H01S 5/0425* (2013.01); *B82Y 20/00* (2013.01); *G02B 6/4214* (2013.01); *G02B 6/4249* (2013.01)

(56) References Cited

U.S. PATENT DOCUMENTS

| | | | |
|---|---|---|---|
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,365,534 A * | 11/1994 | Janssen et al. | 372/36 |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,926,493 A | 7/1999 | O'Brien et al. | |
| 5,951,923 A | 9/1999 | Horie et al. | |
| 6,069,394 A | 5/2000 | Hashimoto et al. | |
| 6,072,197 A | 6/2000 | Horino et al. | |
| 6,147,953 A | 11/2000 | Duncan | |
| 6,153,010 A | 11/2000 | Kiyoku et al. | |
| 6,195,381 B1 | 2/2001 | Botez et al. | |
| 6,239,454 B1 | 5/2001 | Glew et al. | |
| 6,249,536 B1 * | 6/2001 | Farries et al. | 372/64 |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,586,762 B2 | 7/2003 | Kozaki | |
| 6,635,904 B2 | 10/2003 | Goetz et al. | |
| 6,656,615 B2 | 12/2003 | Dwilinski et al. | |
| 6,680,959 B2 | 1/2004 | Tanabe et al. | |
| 6,728,277 B1 * | 4/2004 | Wilson | 372/38.1 |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,882 B2 | 2/2005 | Tsuda et al. | |
| 6,920,166 B2 | 7/2005 | Akasaka et al. | |
| 7,009,199 B2 | 3/2006 | Hall | |
| 7,019,325 B2 | 3/2006 | Li et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imeretal | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike | |
| 7,555,025 B2 | 6/2009 | Yoshida | |
| 7,598,104 B2 | 10/2009 | Teng et al. | |
| 7,691,658 B2 | 4/2010 | Kaeding et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 9/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,252,662 B1 | 8/2012 | Poblenz et al. | |
| 8,254,425 B1 | 8/2012 | Raring | |
| 8,259,769 B1 | 9/2012 | Raring et al. | |
| 8,284,810 B1 | 10/2012 | Sharma et al. | |
| 8,350,273 B2 | 1/2013 | Vielemeyer | |
| 8,351,478 B2 | 1/2013 | Raring et al. | |
| 8,416,825 B1 | 4/2013 | Raring | |
| 8,422,525 B1 | 4/2013 | Raring | |
| 8,427,590 B2 | 4/2013 | Raring | |
| 8,451,876 B1 | 5/2013 | Raring | |
| 8,509,275 B1 | 8/2013 | Raring et al. | |
| 2001/0048114 A1 | 12/2001 | Morita et al. | |
| 2002/0027933 A1 | 3/2002 | Tanabe et al. | |
| 2002/0050488 A1 | 5/2002 | Nikitin et al. | |
| 2002/0085603 A1 | 7/2002 | Okumura | |
| 2002/0105986 A1 | 8/2002 | Yamasaki | |
| 2002/0171092 A1 | 11/2002 | Goetz et al. | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0129810 A1 | 7/2003 | Barth | |
| 2003/0140846 A1 | 7/2003 | Biwa et al. | |
| 2003/0178617 A1 | 9/2003 | Appenzeller et al. | |
| 2003/0200931 A1 | 10/2003 | Goodwin | |
| 2003/0216011 A1 | 11/2003 | Nakamura et al. | |
| 2004/0025787 A1 | 2/2004 | Selbrede et al. | |
| 2004/0027631 A1 * | 2/2004 | Nagano et al. | 359/196 |
| 2004/0060518 A1 | 4/2004 | Nakamura et al. | |
| 2004/0099213 A1 | 5/2004 | Adomaitis et al. | |
| 2004/0104391 A1 | 6/2004 | Maeda et al. | |
| 2004/0151222 A1 | 8/2004 | Sekine | |
| 2004/0196877 A1 | 10/2004 | Kawakami et al. | |
| 2004/0222357 A1 | 11/2004 | King et al. | |
| 2004/0247275 A1 | 12/2004 | Vakhshoori et al. | |
| 2004/0262624 A1 | 12/2004 | Akita et al. | |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0218413 A1 | 10/2005 | Matsumoto et al. | |
| 2005/0224826 A1 | 10/2005 | Keuper et al. | |
| 2005/0229855 A1 | 10/2005 | Raaijmakers | |
| 2005/0230701 A1 | 10/2005 | Huang | |
| 2005/0285128 A1 | 12/2005 | Scherer et al. | |
| 2005/0286591 A1 | 12/2005 | Lee | |
| 2006/0018355 A1 | 1/2006 | Feitisch et al. | |
| 2006/0029112 A1 * | 2/2006 | Young et al. | 372/7 |
| 2006/0030738 A1 | 2/2006 | Vanmaele et al. | |
| 2006/0037529 A1 | 2/2006 | D'Evelyn | |
| 2006/0038193 A1 | 2/2006 | Wu et al. | |
| 2006/0060131 A1 | 3/2006 | Atanackovic | |
| 2006/0066319 A1 | 3/2006 | Dallenbach et al. | |
| 2006/0077795 A1 | 4/2006 | Kitahara et al. | |

(56) References Cited

U.S. PATENT DOCUMENTS

| | | |
|---|---|---|
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenthe et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0061857 A1 | 3/2009 | Kazmi |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0229519 A1 | 9/2009 | Saitoh |
| 2009/0250686 A1* | 10/2009 | Sato et al. ............ 257/13 |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0150020 A1 | 6/2011 | Haase et al. |
| 2011/0164637 A1 | 7/2011 | Yoshizumi et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0281422 A1 | 11/2011 | Wang et al. |
| 2013/0016750 A1 | 1/2013 | Raring et al. |
| 2013/0022064 A1 | 1/2013 | Raring et al. |
| 2013/0064261 A1 | 3/2013 | Sharma et al. |

FOREIGN PATENT DOCUMENTS

| | | |
|---|---|---|
| CN | 1702836 | 11/2005 |
| CN | 101099245 | 1/2008 |
| CN | 10171692 | 4/2008 |
| JP | 07-162081 | 6/1995 |
| JP | 2002-009402 | 1/2002 |
| JP | 2002-185082 | 6/2002 |
| JP | 2004-503923 | 2/2004 |
| JP | 2004-152841 | 5/2004 |
| JP | 2004-186527 | 7/2004 |
| JP | 2006-091285 | 4/2006 |
| JP | 2006-120923 | 5/2006 |
| JP | 2007-173467 A | 7/2007 |
| JP | 2007-529910 | 10/2007 |
| JP | 2007-068398 | 4/2008 |
| JP | 2008-311640 | 12/2008 |
| JP | 2009-021506 | 1/2009 |
| JP | 2009-158893 | 7/2009 |
| JP | 2009-170708 | 7/2009 |
| WO | 2008-041521 | 4/2008 |
| WO | 2010/120819 | 10/2010 |

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).

Adesida et al., "Characteristics of chemically assisted ion beam etching of gallium nitride" Appl. Phys. Lett. 65 (7) (Aug. 1994), pp. 889-891.

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Behfar et al., "Progress in etched Facet Technology for GaN and Blue Lasers" Proc. Of SPIE vol. 6473 (2007), 8 pages.

Bernardini et al., "Spontaneous Polarization and Piezoelectric Constants of III-V Nitrides," 1997, Physical Review B, vol. 56, No. 16, pp. 10024-10027.

(56) References Cited

OTHER PUBLICATIONS

Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Gardner et al. "Blue-emitting InGaN—GaN double-heterostructure light-emitting diodes reaching maximum quantum efficiency above 200 A/cm2", Applied Physics Letters 91, 243506 (2007).
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et al., "Continuous-Wave Operation of m-Plane InGaN Multiple Quantum Well Laser Diodes" The Japan Society of I Applied Physics JJAP Express Letter, vol. 46, No. 9, 2007 pp. L 187-L 189.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells," Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Tyagi et al., "Semipolar (1011) InGaN/GaN Laser Diodes on Bulk GaN Substrates" Japanese Journal of Applied Physics, vol. 46, No. 19, 2007, pp. L444-L445.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.

(56) References Cited

OTHER PUBLICATIONS

International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion of PCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report & Written Opinion of PCT Application No. PCT/US2011/060030, dated Mar. 21, 2012, 11 pages.
Non-Final Office Action of Nov. 20, 2013 for U.S. Appl. No. 13/356,355, 15 pages.
Final Office Action of Jun. 13, 2014 for U.S. Appl. No. 13/356,355, 21 pages.
Non-Final Office Action of Dec. 18, 2014 for U.S. Appl. No. 13/356,355, 23 pages.

* cited by examiner 2 row configuration

Single row configuration
Spatial multiplexing vertical or horizontal w/ 90 degree polarization rotation

US 9,025,635 B2

LASER PACKAGE HAVING MULTIPLE EMITTERS CONFIGURED ON A SUPPORT MEMBER

This application is a continuation-in-part of U.S. application Ser. No. 13/356,355 filed on Jan. 23, 2012, which claims priority to U.S. Provisional Application 61/435,578 filed on Jan. 24, 2011, each of which is incorporated by reference for all purposes.

BACKGROUND OF THE INVENTION

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

The conventional light bulb dissipates more than 90% of the energy used as thermal energy.
The conventional light bulb routinely fails due to thermal expansion and contraction of the filament element.
The conventional light bulb emits light over a broad spectrum, much of which is not perceived by the human eye.
The conventional light bulb emits in all directions, which is undesirable for applications requiring strong directionality or focus, e.g. projection displays, optical data storage, etc.

In 1960, the laser was demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green and blue lasers. Lamp pumped solid-state lasers were developed in the infrared, and the output wavelength was converted to the visible using specialty crystals with nonlinear optical properties. A green lamp pumped solid-state lasers had 3 stages: electricity powers lamp, lamp excites gain crystal, which lases at 1064 nm, 1064 nm goes into frequency conversion crystal, which converts, to visible 532 nm. The resulting green and blue lasers were called "lamp pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid-state lasers typically had energy storage properties, which made the lasers difficult to modulate at high speeds, which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal, which converts, to visible 532 nm. The DPSS laser technology extended the life and improved the efficiency of the LPSS lasers, and further commercialization ensue into more high-end specialty industrial, medical, and scientific applications. The change to diode pumping increased the system cost and required précised temperature controls, leaving the laser with substantial size, power consumption, while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging. Additionally, while the diode-SHG lasers have the benefit of being directly modulate-able, they suffer from severe sensitivity to temperature which limits their application.

High power direct diode lasers have been in existence for the past few decades, beginning with laser diodes based on the GaAs material system, then moving to the AlGaAsP and InP material systems. More recently, high power lasers based on GaN operating in the short wavelength visible regime have become of great interest. More specifically, laser diodes operating in the violet, blue, and eventually green regimes are attracting attention due to their application in optical storage, display systems, and others. Currently, high power laser diodes operating in these wavelength regimes are based on polar c-plane GaN. The conventional polar GaN based laser diodes have a number of applications, but unfortunately, the device performance is often inadequate.

BRIEF SUMMARY OF THE INVENTION

The present invention provides a method and device for emitting electromagnetic radiation at high power using nonpolar or semipolar gallium containing substrates such as GaN, AlN, InN, InGaN, AlGaN, and AlInGaN, and others. In various embodiments, a laser device comprises number of laser emitters, which emit red, green, or blue electromagnetic radiation, integrated onto a substrate or back member. Merely by way of example, the invention can be applied to applications such as white lighting, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, transformations, transportations, leveling, curing and other chemical treatments, heating, cutting and/or ablating, pumping other optical devices, other optoelectronic devices and related applications, and source lighting and the like.

In a specific embodiment, the present invention provides an optical module apparatus comprising a form factor characterized by a length, a width, and a height. In an example, the height is characterized by a dimension of less than 11 mm, and greater than 1 mm, although there may be variations. The apparatus has a support member and a plurality of gallium and nitrogen containing laser diode devices numbered from 1 through N overlying the support member. Each of the laser device is capable of an emission of a laser beam, where N is greater than 1. The emission can comprise a blue emission ranging from 415-485 nm wavelength and/or a green emission ranging from 500-560 nm wavelength. The support member is configured to transport thermal energy from the plurality of laser diode devices to a heat sink. The apparatus has a free space with a non-guided characteristic capable of transmitting the emission of each of the laser beams from a plurality of laser beams. A combiner is configured to receive a plurality of laser beams of N incoming laser beams from the plurality of gallium and nitrogen containing laser diode devices. The combiner functions to cause an output beam with a selected wavelength range, a spectral width, a power, and a spatial configuration, where N is greater than 1. In an example, the combiner consists of free-space optics to create one or more free space optical beams. At least one of the incoming beams is characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, an operating optical output power of at least 5 W to 200 W, characterizes the output beam from the plurality of laser beams. The apparatus also has an electrical input interface configured to couple electrical input power to the plurality of laser diode devices and a thermal impedance of less than 4 degrees Celsius per electrical watt of electrical input power characterizing a thermal path from the laser device to a heat sink. The apparatus has an optical output power degradation of less than 20% in 500 hours when operated within the output power range with a constant input current at a base temperature of 25 degrees Celsius.

In an alternative specific embodiment, the present invention provides an optical module apparatus. The apparatus has a form factor characterized by a length, a width, and a height. In an example, the height is characterized by a dimension of less than 11 mm and greater than 1 mm, although there may be variations. In a specific embodiment, the apparatus has a support member and a plurality of gallium and nitrogen containing laser diode devices numbered from 1 through N overlying the support member. Each of the laser device is capable of an emission of a laser beam, where N is greater than 1. The emission comprises a blue emission ranging from 415 nm to 485 nm wavelength and/or a green emission ranging from 500 nm to 560 nm wavelength. The support member is configured to transport thermal energy from the plurality of laser diode devices to a heat sink. The apparatus has a combiner configured to receive a plurality of laser beams of N incoming laser beams. The apparatus has at least one of the incoming beams characterized by a polarization purity of greater than 60% and less than 100% although there can be variations. The apparatus has a predetermined rated operating optical output power range including at least 5 W and greater. The apparatus has an electrical input interface configured to couple electrical power to the plurality of laser diode devices and a thermal impedance of less than 4 degrees Celsius per electrical watt of input power characterizing a thermal path from the laser device to a heat sink.

In yet an alternative embodiment, the present invention provides an optical module apparatus. The apparatus has a form factor characterized by a length, a width, and a height. In an example, the height is characterized by a dimension of less than 11 mm and greater than 1 mm, although there may be variations. The apparatus has a support member and a plurality of gallium and nitrogen containing laser diode devices numbered from 1 through N overlying the support member. Each of the laser device is capable of an emission of a laser beam, where N is greater than 1. The emission comprises a blue emission ranging from 415 nm to 485 nm wavelength and/or a green emission ranging from 500 nm to 560 nm wavelength. Each of the gallium and nitrogen containing laser diodes is characterized by a nonpolar or a semipolar oriented surface region. In an example, the apparatus has a laser stripe region overlying the nonpolar or semipolar surface region. Each of the laser stripe regions is oriented in a c-direction or a projection of a c-direction. In an example, the laser stripe region is characterized by a first end and a second end. The support member is configured to transport thermal energy from the plurality of laser diode devices to a heat sink. The apparatus has a combiner configured to receive a plurality of laser beams of N incoming laser beams. The combiner functions to cause an output beam with a selected wavelength range, spectral width, power, and spatial configuration, where N is greater than 1. The apparatus has at least one of the incoming beams characterized by a polarization purity of greater than 60% up to 100% although there may be variations. In an example, the optical module apparatus has a predetermined rated operating optical output power range including at least 5 W and greater. The apparatus has an electrical input interface configured to couple electrical power to the plurality of laser diode devices. A thermal impedance of less than 4 degrees Celsius per electrical watt of input power characterizes a thermal path from the laser device to a heat sink.

In an example, the nonpolar or semipolar oriented surface region is a semipolar orientation characterized by the {20-21} or {20-2-1} plane, or alternatively, the nonpolar or semipolar oriented surface region is a semipolar orientation characterized by the {30-31} or {30-31} plane. Each of these planes may be slightly or substantially off cut depending upon the embodiment. In an example, the nonpolar or semipolar oriented surface region is a nonpolar orientation characterized by m-plane. In an example, each of the laser devices is operable in an environment comprising at least 150,000 parts per-million (ppm) oxygen gas. Each of the laser device is substantially free from efficiency degradation over a time period from the oxygen gas. In an example, each of the laser devices comprises a front facet and a rear facet.

Additional benefits are achieved over pre-existing techniques using the present invention. In particular, the present invention enables a cost-effective optical device for laser applications, including laser bar for projectors, and the like. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a nonpolar or semipolar gallium nitride material capable of achieving a violet or blue or green emission, among others. In one or more embodiments, the laser device is capable of emitting long wavelengths such as those ranging from about 430 nm to 470 nm for the blue wavelength region or 500 nm to about 540 nm for the green wavelength region, but can be others such as the violet region. Of course, there can be other variations, modifications, and alternatives. Depending upon the embodiment, one or more of these benefits may be achieved. These and other benefits may be described throughout the present specification and more particularly below.

A further understanding of the nature and advantages of the present invention may be realized by reference to the latter portions of the specification and attached drawings.

DETAILED DESCRIPTION OF THE INVENTION

Figure 1:
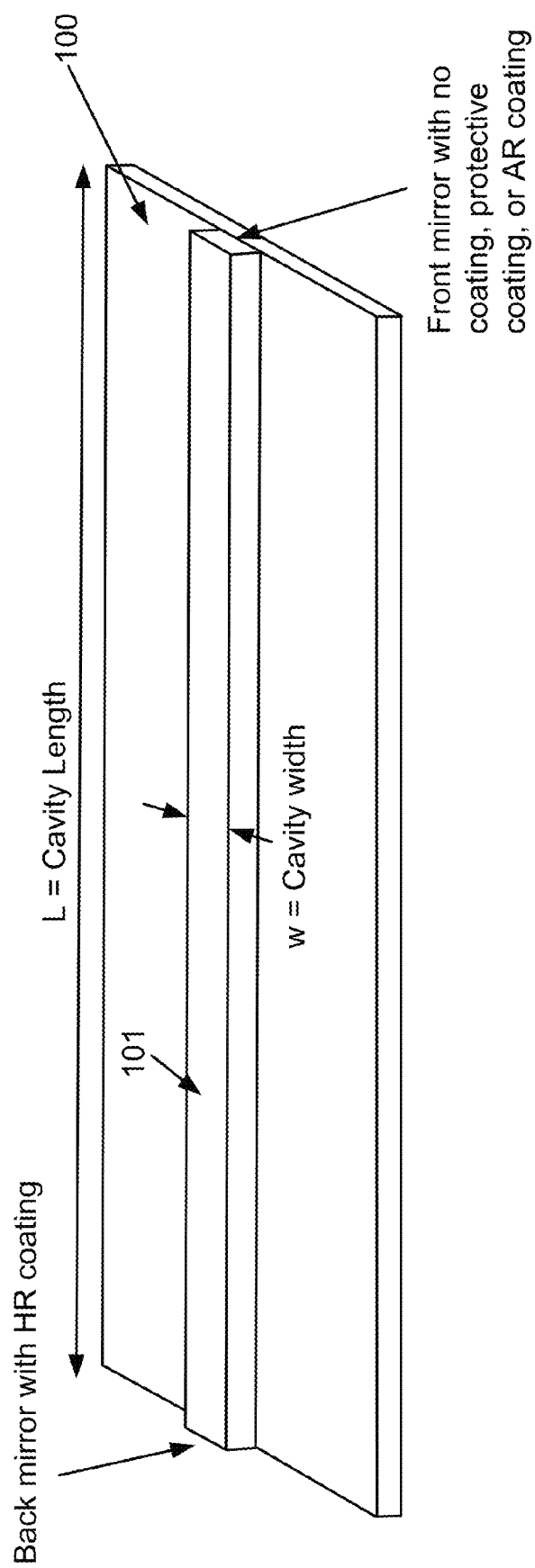
FIG. 1 is a simplified diagram illustrating an optical device according to an embodiment of the present invention.

Optical module devices that combine the light output from multiple laser chips and/or laser bars and couple the light into a common fiber or medium are well established in the red and infrared wavelength regimes. Such module devices serve applications where very high powers (>10 W to >100 W) and/or very high brightness are required or where a remote light source can serve an increased functionality. Laser diodes based on GaN that emit in the blue and green wavelength regime have seen improvements in efficiency, power, and lifetime over the years. Optical module devices leveraging these high performance blue and green GaN-based lasers are sure to emerge as key light sources providing greater than 5 W to greater than 50 W or 100 W or 200 W of optical output power in existing and emerging applications where high brightness or remote sources of blue and/or green light are needed. Such applications include high brightness displays, specialty lighting, medical devices, defense systems, and others.

A popular and efficient way to combine the light from the emitters within the module is by direct fiber coupling. In this configuration the laser chips or bars would be mounted onto a carrier and the emitted light would be coupled into a fiber by either using a close optic such as fast axis collimating (FAC) lens first then the fiber, or directly using a fiber with a shaped lens formed at the end facing the laser. In either case the fiber is positioned close to the laser facet. Typical fiber dimensions ranges from 100 μm to 800 μm, and with a NA of 0.18 or greater. In these configurations the fibers are usually in close vicinity to the laser diode facet region, which are well-known for their sensitivity to optical or other damage mechanisms. Typical distances of the optical fiber from the laser diode facet would be about 0.2 mm to about 10 mm. Although this a proven method for combining the optical outputs from red or infrared laser diodes, drawbacks could exist when fiber coupling blue or green devices based on conventional c-plane based GaN lasers. One such drawback is reduced lifetime and rapid degradation of the optical output from the module. Such reliability issues could result from specific light behaviors due to close proximity of optical surfaces and especially fiber end to the emitting facet of the laser. These and other drawbacks have been overcome with the present method and devices, which are described throughout the present specification and more particularly below.

The present invention provides high power GaN-based laser devices and related methods for making and using these laser devices. Specifically, laser devices are configured to operate with 0.5 W to 5 W or 5 W to 20 W or 20 W to 100 W or 200 W, or greater of output power in the blue or green wavelength regimes. The laser devices are manufactured from bulk nonpolar or semipolar gallium and nitrogen containing substrates. As mentioned above, the output wavelength of the laser devices can be in the blue wavelength region of 425 nm to 475 nm and the green wavelength region 500 nm to 545 nm. Laser devices according to embodiments of the present invention can also operate in wavelengths such as violet (395 nm to 425 nm) and blue-green (475 nm to 505 nm). The laser devices can be used in various applications, such as projection system where a high power laser is used to project video content.

FIG. 1 is a simplified diagram illustrating an optical device. As an example, the optical device includes a gallium nitride substrate member 101 having a crystalline surface region characterized by a semipolar or nonpolar orientation. For example, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0 \le x$, y, $x+y \le 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. In various embodiments, the GaN substrate is characterized by a nonpolar orientation (e.g., m-plane), where waveguides are oriented in the c-direction or substantially orthogonal to the a-direction.

In certain embodiments, GaN surface orientation is substantially in the {20-21} orientation, and the device has a laser stripe region formed overlying a portion of the off-cut crystalline orientation surface region. For example, the laser stripe region is characterized by a cavity orientation substantially in a projection of a c-direction, which is substantially normal to an a-direction. In a specific embodiment, the laser strip region has a first end 107 and a second end 109. In a preferred embodiment, the device is formed on a projection of a c-direction on a {20-21} gallium and nitrogen containing substrate having a pair of cleaved mirror structures, which face each other.

In a preferred embodiment, the device has a first cleaved facet provided on the first end of the laser stripe region and a second cleaved facet provided on the second end of the laser stripe region. In one or more embodiments, the first cleaved is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. The first mirror surface can also have an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface has an anti-reflective coating.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 430 to 470 nm); green (e.g., 500 to 540 nm), or others. In a preferred embodiment, the spontaneously emitted light is highly polarized and is characterized by a polarization ratio of greater than 0.4. In another specific embodiment on a semi-polar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with one or more of the following epitaxially grown elements:

an n-GaN cladding layer with a thickness from 100 nm to 3000 nm with Si doping level of $5E17$ $cm^{-3}$ to $3E18$ $cm^{-3}$;

an n-side SCH layer comprised of InGaN with molar fraction of indium of between 2% and 10% and thickness from 20 nm to 200 nm;

multiple quantum well active region layers comprised of at least two 2.0 nm to 8.5 nm InGaN quantum wells separated by 1.5 nm and greater, and optionally up to about 12 nm, GaN or InGaN barriers;

a p-side SCH layer comprised of InGaN with molar a fraction of indium of between 1% and 10% and a thickness from 15 nm to 100 nm or an upper GaN-guide layer;

an electron blocking layer comprised of AlGaN with molar fraction of aluminum of between 6% and 22% and thickness from 5 nm to 20 nm and doped with Mg;

a p-GaN cladding layer with a thickness from 400 nm to 1000 nm with Mg doping level of $2E17$ $cm^{-3}$ to $2E19$ $cm^{-3}$; and a p++-GaN contact layer with a thickness from 20 nm to 40 nm with Mg doping level of $1E19$ $cm^{-3}$ to $1E21$ $cm^{-3}$.

Figure 2:
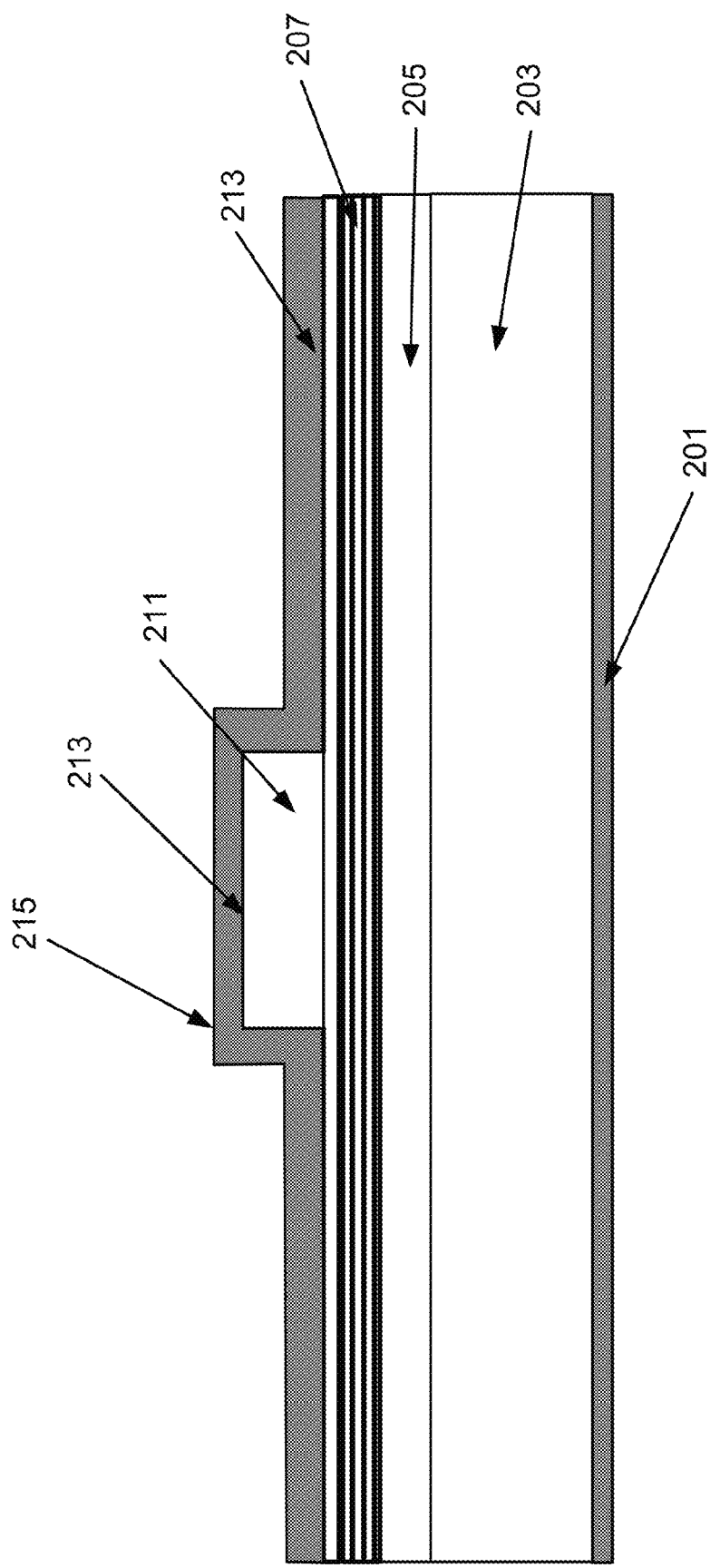
FIG. 2 is a cross-sectional view of a laser device according to an embodiment of the present invention.

FIG. 2 is a cross-sectional view of a laser device 200. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

An n-type $Al_uIn_vGa_{1-u-v}N$ layer, where $0 \le u$, $v$, $u+v \le 1$, is deposited on the substrate. The carrier concentration may lie in the range between about $10^{16}$ $cm^{-3}$ and $10^{20}$ $cm^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes 213 contact region. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au).

Active region 207 preferably includes one to ten quantum well regions or a double heterostructure region for light emission. Following deposition of the n-type $Al_u In_v Ga_{1-u-v} N$ layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_w In_x Ga_{1-w-x} N$ and $Al_y In_z Ga_{1-y-z} N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_s In_t Ga_{1-s-t} N$, where 0≤s, t, s+t≤1, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes 213 contact region.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIGS. 1 and 2 and described above are typically suitable for relative low-power applications.

In various embodiments, the present invention realizes high output power from a diode laser is by widening one or more portions of the laser cavity member from the single lateral mode regime of 1.0-3.0 μm to the multi-lateral mode range 5.0-20 μm. In some cases, laser diodes having cavities at a width of 50 μm or greater are employed.

The laser stripe length, or cavity length ranges from 300 to 3000 μm and employs growth and fabrication techniques such as those described in U.S. patent application Ser. No. 12/759, 273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

One difficulty with fabricating high-power GaN-based lasers with wide cavity designs is a phenomenon where the optical field profile in the lateral direction of the cavity becomes asymmetric where there are local bright regions and local dim regions. Such behavior is often referred to as filamenting and can be induced by lateral variations in the index of refraction or thermal profile, which alters the mode guiding characteristics. Such behavior can also be a result of non-uniformities in the local gain/loss caused by non-uniform injection of carriers into the active region or current crowding where current is preferentially conducted through the outer regions of the laser cavity. That is, the current injected through the p-side electrode tends towards the edge of the etched p-cladding ridge/stripe required for lateral waveguiding, and then conducted downward where the holes recombine with electrons primarily near the side of the stripe. Regardless of the cause, such filamenting or non-symmetric optical field profiles can lead to degraded laser performance as the stripe width is increased.

Figure 3:
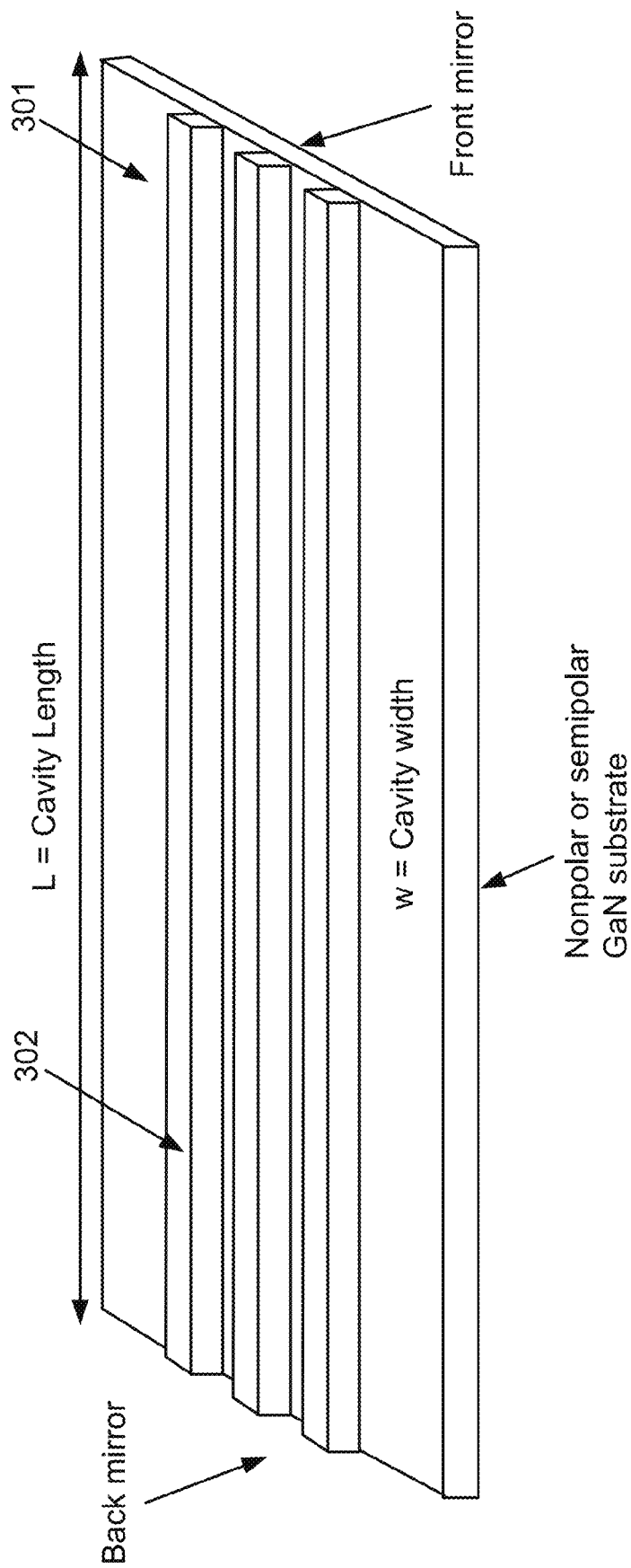
FIG. 3 is a simplified diagram illustrating a laser device having a plurality of emitters according to an embodiment of the present invention.

FIG. 3 is a simplified diagram illustrating a laser device having a plurality of emitters according to an embodiment of the present invention. As shown in FIG. 3, a laser device includes a substrate and a plurality of emitters. Each cavity member, in conjunction with the underlying active region within the substrate and other electrical components, is a part of a laser diode. The laser device in FIG. 3 includes three laser diodes, each having its emitter or cavity member (e.g., cavity member 302 functions a waveguide of a laser diode) and sharing the substrate 301, which contains one or more active regions. In various embodiments, the active regions include quantum wells or a double heterostructure for light emission. The cavity members function as waveguides. A device with multiple cavity members integrated on a single substrate and the method of manufacturing thereof are described in the U.S. Provisional Patent Application No. 61/345,561, filed May 17, 2010, which is hereby incorporated by reference.

The substrate shown in FIG. 3 contains gallium and nitrogen material fabricated from nonpolar or semipolar bulk GaN substrate. The cavity members as shown are arranged in parallel to one another. For example, cavity member 301 includes a front mirror and a back mirror, similar to the cavity member 101 illustrated in FIG. 1. Each of the laser cavities is characterized by a cavity width, w, ranging from about 1 to about 6 μm. Such arrangement of cavity members increases the effective stripe width while assuring that the cavity members are uniformly pumped. In an embodiment, cavity members are characterized by a substantially equal length and width.

Depending on the application, a high power laser device can have a number of cavity members. The number of cavity members, n, can range from 2 to 5, 10, or even 20. The lateral spacing, or the distance separating one cavity member from another, can range from 2 μm to 25 μm, depending upon the requirements of the laser diode. In various embodiments, the length of the cavity members can range from 300 μm to 2000 μm, and in some cases as much as 3000 μm.

In a preferred embodiment, laser emitters (e.g., cavity members as shown) are arranged as a linear array on a single chip to emit blue or green laser light. The emitters are substantially parallel to one another, and they can be separated by 3 μm to 15 μm, by 15 μm to 75 μm, by 75 μm to 150 μm, or by 150 μm to 300 μm. The number of emitters in the array can vary from 3 to 15 or from 15 to 30, from 30 to 50, or from 50 to 100, or more than 100. Each emitter may produce an average output power of 25 to 50 mW, 50 to 100 mW, 100 to 250 mW, 250 to 500 mW, 500 to 1000 mW, or greater than 1 W. Thus the total output power of the laser device having multiple emitters can range from 200 to 500 mW, 500 to 1000 mW, 1-2 W, 2-5 W, 5-10 W, 10-20 W, and greater than 20 W.

With current technology, the dimension of the individual emitters would be widths of 1.0 to 3.0 µm, 3.0 to 6.0 µm, 6.0 to 10.0 µm, 10 to 20.0 µm, 20 to 30 µm, and greater than 30 µm. The lengths range from 400 µm to 800 µm, 800 µm to 1200 µm, 1200 µm to 1600 µm, or greater than 1600 µm.

The cavity member has a front end and a back end. The laser device is configured to emit laser beam through the front mirror at the front end. The front end can have anti-reflective coating or no coating at all, thereby allowing radiation to pass through the mirror without excessive reflectivity. Since no laser beam is to be emitted from the back end of the cavity member, the back mirror is configured to reflect the radiation back into the cavity. For example, the back mirror includes highly reflective coating with a reflectivity greater than 85% or 95%.

Figure 4:
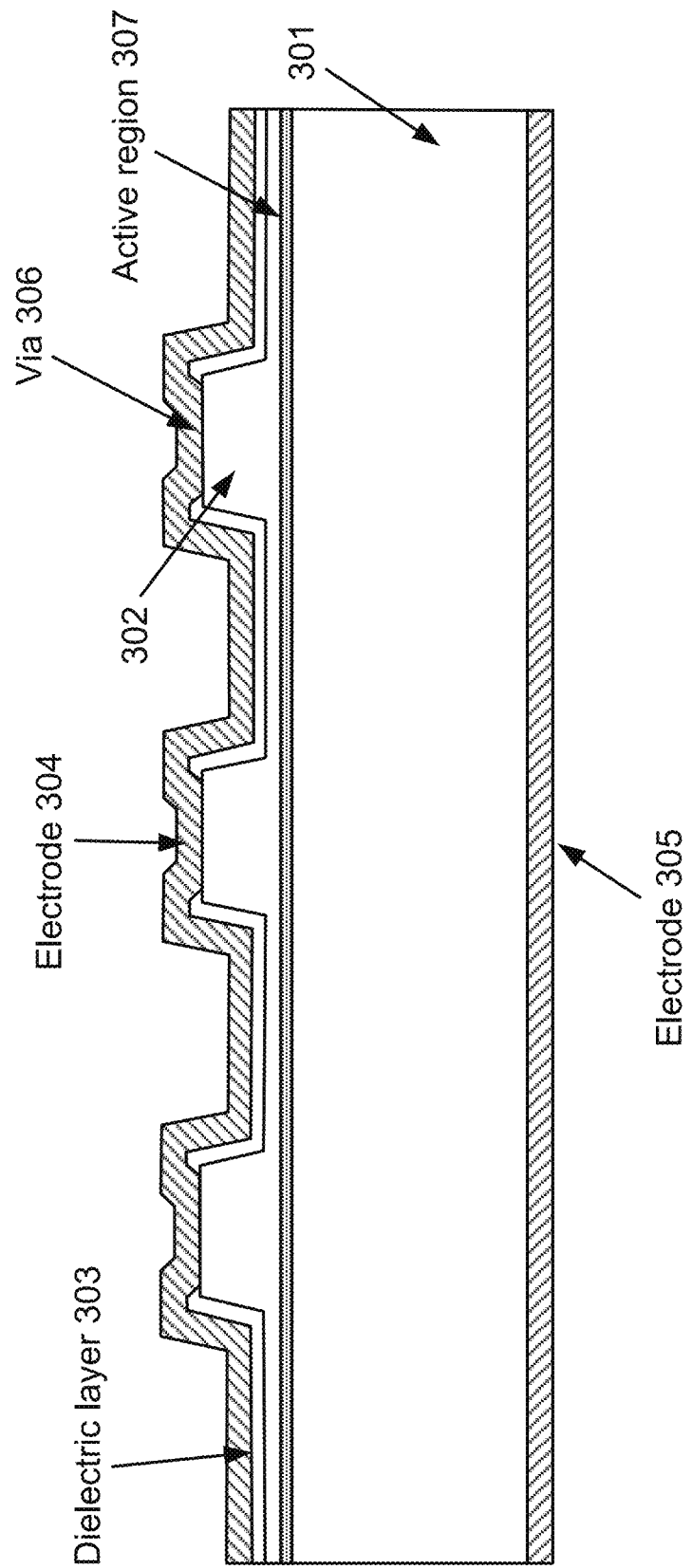
FIG. 4 is a simplified diagram illustrating a front view of a laser device with multiple cavity members according to an embodiment of the present invention.

FIG. 4 is a simplified diagram illustrating a front view of a laser device with multiple cavity members. As shown in FIG. 4, an active region 307 can be seen as positioned in the substrate 301. The cavity member 302 as shown includes a via 306. Vias are provided on the cavity members and opened in a dielectric layer 303, such as silicon dioxide. The top of the cavity members with vias can be seen as laser ridges, which expose electrode 304 for an electrical contact. The electrode 304 includes p-type electrode. In a specific embodiment, a common p-type electrode is deposited over the cavity members and dielectric layer 303, as illustrated in FIG. 4.

The cavity members are electrically coupled to each other by the electrode 304. The laser diodes, each having an electrical contact through its cavity member, share a common n-side electrode. Depending on the application, the n-side electrode can be electrically coupled to the cavity members in different configurations. In a preferred embodiment, the common n-side electrode is electrically coupled to the bottom side of the substrate. In certain embodiments, re-contact is on the top of the substrate, and the connection is formed by etching deep down into the substrate from the top and then depositing metal contacts. For example, laser diodes are electrically coupled to one another in a parallel configuration. In this configuration, when current is applied to the electrodes, all laser cavities can be pumped relatively equally. Further, since the ridge widths will be relatively narrow in the 1.0 to 5.0 µm range, the center of the cavity member will be in close vicinity to the edges of the ridge (e.g., via) such that current crowding or non-uniform injection will be mitigated. Most importantly, filamenting can be prevented and the lateral optical field profile can be symmetric in such narrow cavities as shown in FIG. 2A.

It is to be appreciated that the laser device with multiple cavity members has an effective ridge width of n×w, which could easily approach the width of conventional high power lasers having a width in the 10 to 50 µm range. Typical lengths of this multi-stripe laser could range from 400 µm to 2000 µm, but could be as much as 3000 µm. A schematic illustration of a conventional single stripe narrow ridge emitter intended for lower power applications of 5 to 500 mW is shown in FIG. 1 with the resulting laterally symmetric field profile in FIG. 2A. A schematic diagram of a multi-stripe emitter as an example this embodiment intended for operation powers of 0.5 to 10 W is shown in FIG. 2.

The laser device illustrated in FIGS. 3 and 4 has a wide range of applications. For example, the laser device can be coupled to a power source and operate at a power level of 0.5 to 10 W. In certain applications, the power source is specifically configured to operate at a power level of greater than 10 W. The operating voltage of the laser device can be less than 5 V, 5.5 V, 6 V, 6.5 V, 7 V, and other voltages. In various embodiments, the wall plug efficiency (e.g., total electrical-to-optical power efficiency) can be 15% or greater, 20% or greater, 25% or greater, 30% or greater, 35% or greater.

Figure 5A:
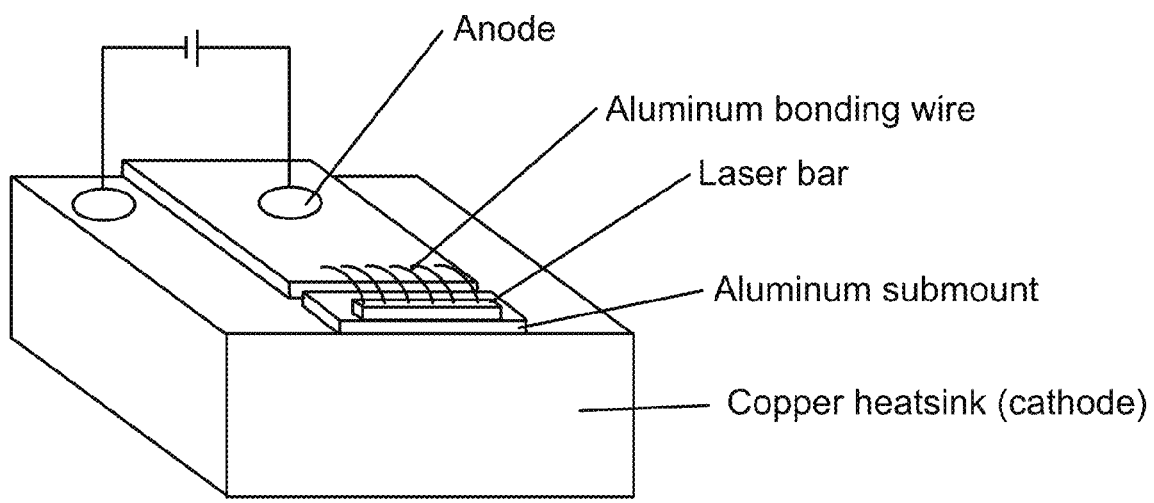
FIGS. 5A and 5B are diagrams illustrating a laser package having "p-side" facing up according to an embodiment of the present invention.
Figure 5B:
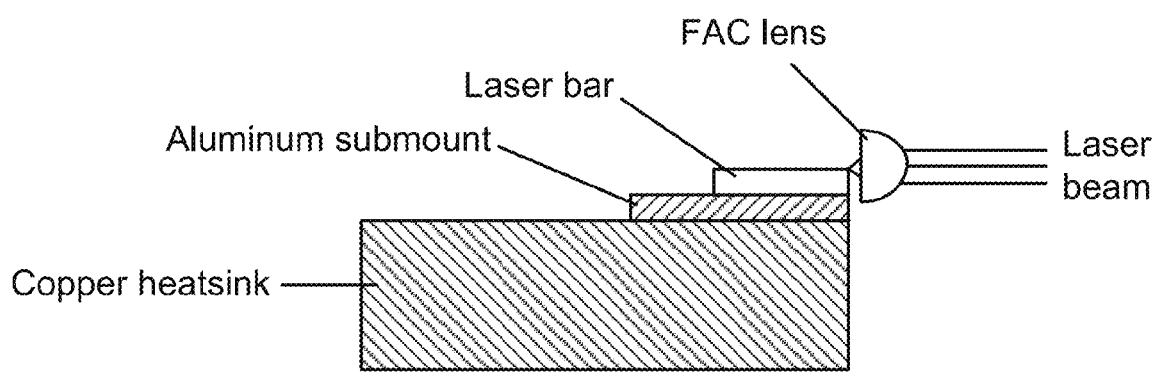

A typical application of laser devices is to emit a single ray of laser light. As the laser device includes a number of emitters, an optical member is needed to combine or collimate output from the emitters. FIGS. 5A and 5B are diagrams illustrating a laser package having "p-side" facing up. As shown in FIG. 5A, a laser bar is mounted on a submount. The laser bar includes an array of emitters (e.g., as illustrated in FIGS. 3 and 4). The laser bar is attached the submount, which is positioned between the laser bar and a heat sink. It is to be appreciated that the submount allows the laser bar (e.g., gallium nitride material) to securely attached to the heat sink (e.g., copper material with high thermal emissivity). In various embodiments, submount includes aluminum nitride material characterized by a high thermal conductivity. For example, thermal conductivity for aluminum nitride material used in the submount can exceed 200 W/(mk). Other types of materials can be used for submount as well, such as diamond, copper tungsten alloy, beryllium oxide. In a preferred embodiment, the submount materials are used to compensate coefficient of thermal expansion (CTE) mismatch between the laser bar and the heat sink.

In FIG. 5A, the "p-side" (i.e., the side with emitters) of the laser bar faces upward and thus is not electrically coupled to the submount. The p-side of the laser bar is electrically coupled to the anode of a power source through a number of bonding wires. Since both the submount and the heat sink are conductive, the cathode electrode of the power source can be electrically coupled to the other side of the laser bar through the submount and the heat sink.

In a preferred embodiment, the array of emitters of the laser bar is manufactured from a gallium nitride substrate. The substrate can have surface characterized by a semi-polar or non-polar orientation. The gallium nitride material allows the laser device to be packaged without hermetic sealing. More specifically, by using the gallium nitride material, the laser bar is substantially free from AlGaN or InAlGaN claddings. When the emitter is substantially in proximity to p-type material, the laser device is substantially free from p-type AlGaN or p-type InAlGaN material. Typically, AlGaN or InAlGaN claddings are unstable when operating in normal atmosphere, as they interact with oxygen. To address this problem, conventional laser devices comprising AlGaN or InAlGaN material are hermetically sealed to prevent interaction between AlGaN or InAlGaN and air. In contrast, since AlGaN or InAlGaN claddings are not present in laser devices according to embodiments of the present invention, the laser devices does not need to be hermetically packaged. The cost of manufacturing laser devices and packages according to embodiments of the present invention can be lower than that of conventional laser devices by eliminating the need for hermetic packaging.

FIG. 5B is a side view diagram of the laser device illustrated in FIG. 5A. The laser bar is mounted on the submount, and the submount is mounted on the heat side. As explained above, since the laser bar includes a number of emitters, a collimating lens is used to combine the emitted laser to form a desired laser beam. In a preferred embodiment, the collimating lens is a fast-axis collimating (FAC) lens that is characterized by a cylindrical shape.

Figure 6A:
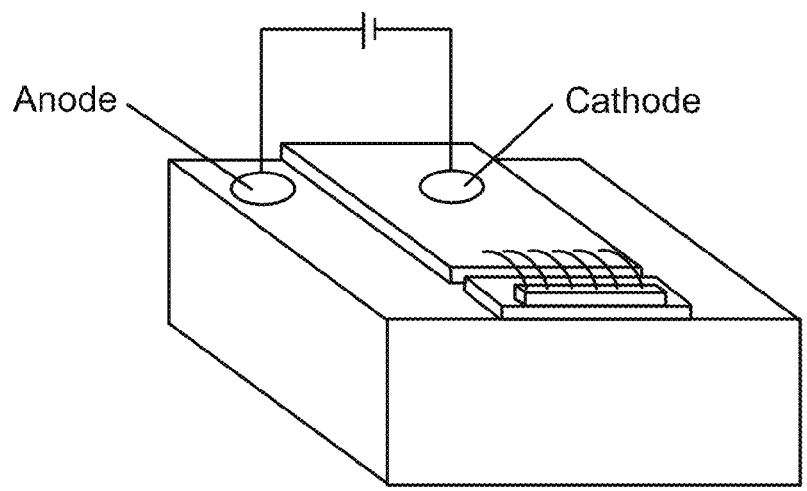
FIGS. 6A and 6B are simplified diagram illustrating a laser package having "p-side" facing down according to an embodiment of the present invention.
Figure 6B:
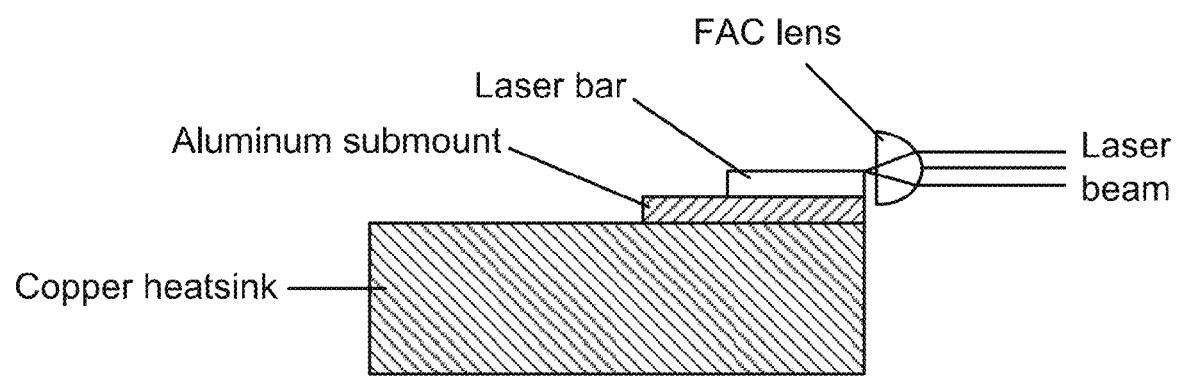

FIGS. 6A and 6B are simplified diagram illustrating a laser package having "p-side" facing down according to an embodiment of the present invention. In FIG. 6A, a laser bar is mounted on a submount. The laser bar includes an array of emitters (e.g., as illustrated in FIGS. 3 and 4). In a preferred embodiment, the laser bar includes substrate characterized by a semipolar or non-polar orientation. The laser bar is attached the submount, which is positioned between the laser bar and a heat sink. The "p-side" (i.e., the side with emitters) of the laser bar faces downed and thus is directly coupled to the submount. The p-side of the laser bar is electrically coupled to the anode of a power source through the submount and/or the heat sink. The other side of the laser bar is electrically coupled to the cathode of the power source through a number of bonding wires.

FIG. 6B is a side view diagram of the laser device illustrated in FIG. 6A. As shown, the laser bar is mounted on the submount, and the submount is mounted on the heat side. As explained above, since the laser bar includes a number of emitters, a collimating lens is used to combine the emitted laser to form a desired laser beam. In a preferred embodiment, the collimating lens is a fast-axis collimating (FAC) lens that is characterized by a cylindrical shape.

Figure 7:
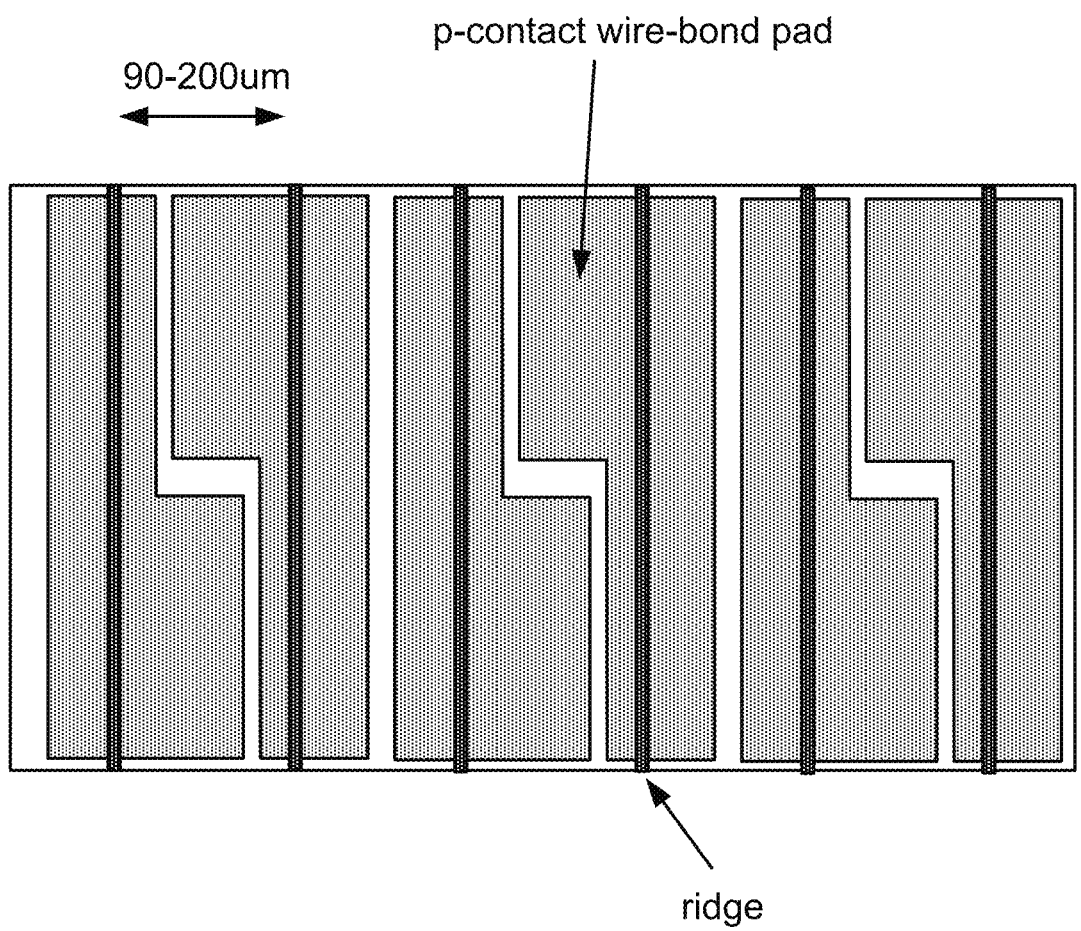
FIG. 7 is a simplified diagram illustrating an individually addressable laser package according to an embodiment of the present invention.

FIG. 7 is a simplified diagram illustrating an individually addressable laser package according to an embodiment of the present invention. The laser bar includes a number of emitters separated by ridge structures. Each of the emitter is characterized by a width of about 90-200 µm, but it is to be understood that other dimensions are possible as well. Each of the laser emitters includes a pad for p-contact wire bond. For example, electrodes can be individually coupled to the emitters so that it is possible to selectively turning a emitter on and off. The individually addressable configuration shown in FIG. 7 provides numerous benefits. For example, if a laser bar having multiple emitters is not individually addressable, laser bar yield during manufacturing can be a problem, since many individual laser devices need to be good in order for the bar to pass, and that means laser bar yield will be lower than individual emitter yield. In addition, setting up the laser bar with single emitter addressability makes it possible to screen each emitter. In a certain embodiments, a control module is electrically coupled to the laser for individually controlling devices of the laser bar.

Figure 8:
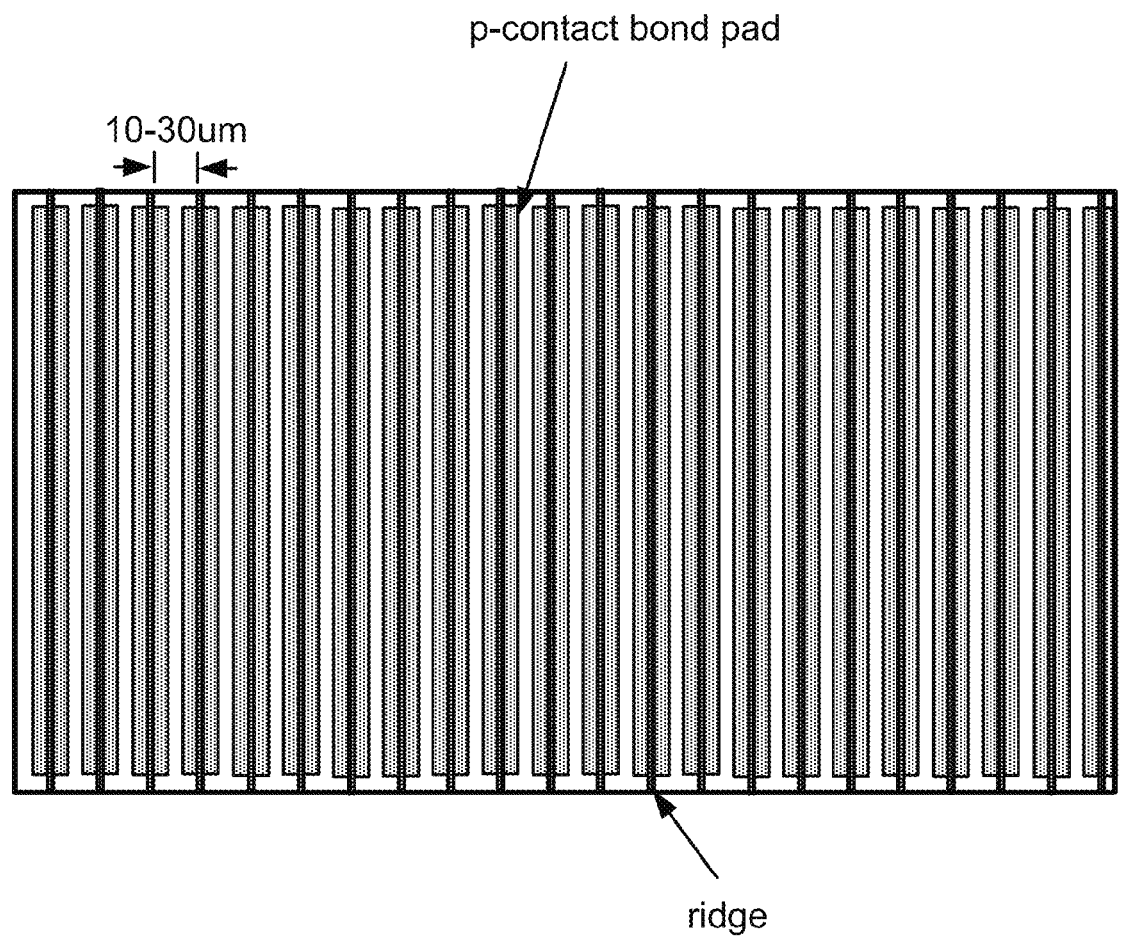
FIG. 8 is a simplified diagram illustrating a laser bar having a patterned bonding substrate according to an embodiment of the present invention.

FIG. 8 is a simplified diagram illustrating a laser bar having a patterned bonding substrate according to an embodiment of the present invention. As shown, laser devices are characterized by a width of around 30 µm. Depending on the application, other widths are possible as well. Laser emitters having pitches smaller than about 90 microns are difficult to form wire bonds. In various embodiments, a patterned bonding substrate is used for forming contacts. For example, the pattern bonding substrates allows for the width to be as low as 10-30 µm.

Figure 9:
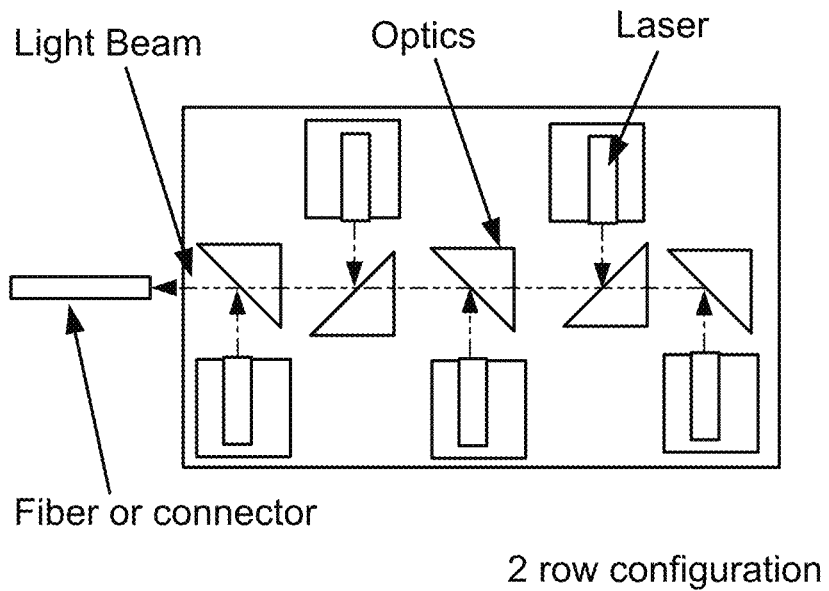
FIG. 9 is a simplified diagram illustrating a plurality of laser bars configured with optical combiners according to embodiments of the present invention.
Figure 9:
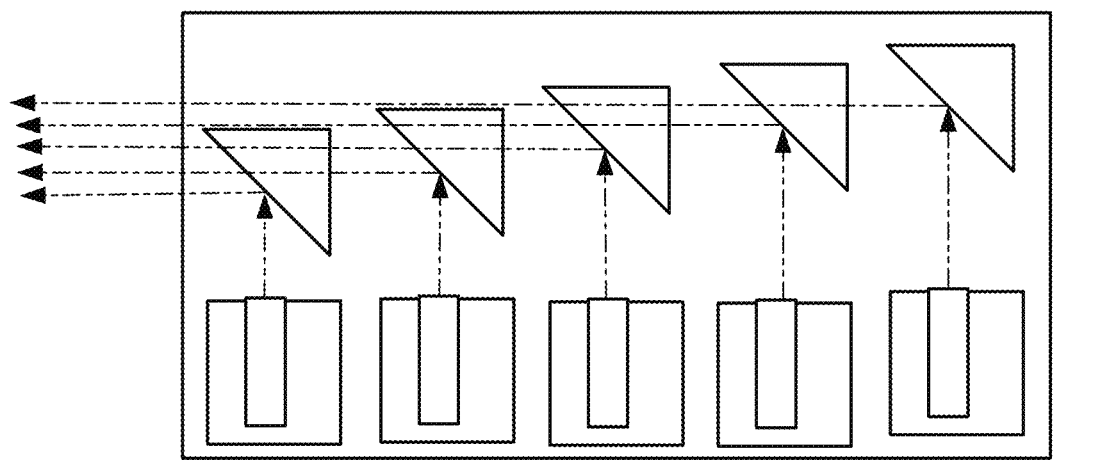

FIG. 9 is a simplified diagram illustrating laser bars configured with an optical combiner according to embodiments of the present invention. As shown, the diagram includes a package or enclosure for multiple emitters. Each of the devices is configured on a single ceramic or multiple chips on a ceramic, which are disposed on common heatsink. As shown, the package includes all free optics coupling, collimators, mirrors, spatially or polarization multiplexed for free space output or refocused in a fiber or other waveguide medium. As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

Figure 10:
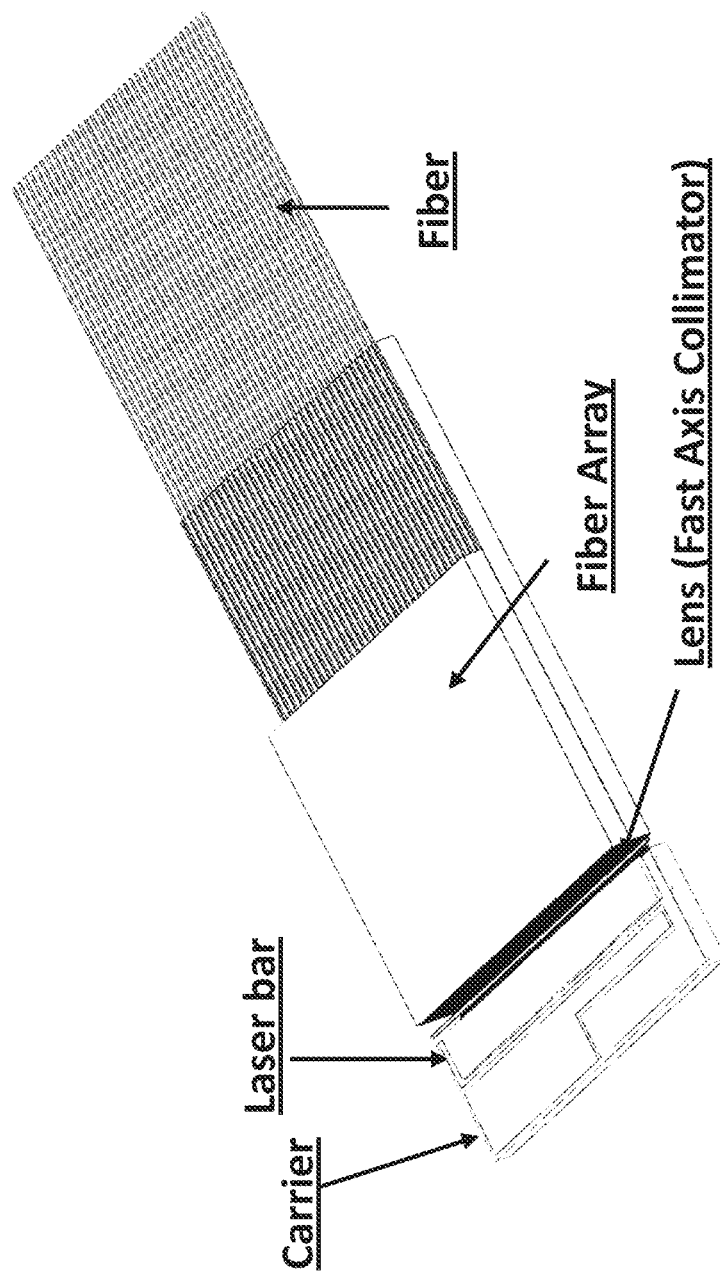
FIG. 10 is a schematic of laser module with a fibered array according to an example of the present invention.

FIG. 10 is an example of laser module coupled to a fiber array. Each emitter from the laser bar is individually coupled into the fiber array through fast axis collimation (FAC) lens. In such a configuration the fiber is in the vicinity of the laser diode chip, typically within 0.2 to 10 mm.

Figure 11:
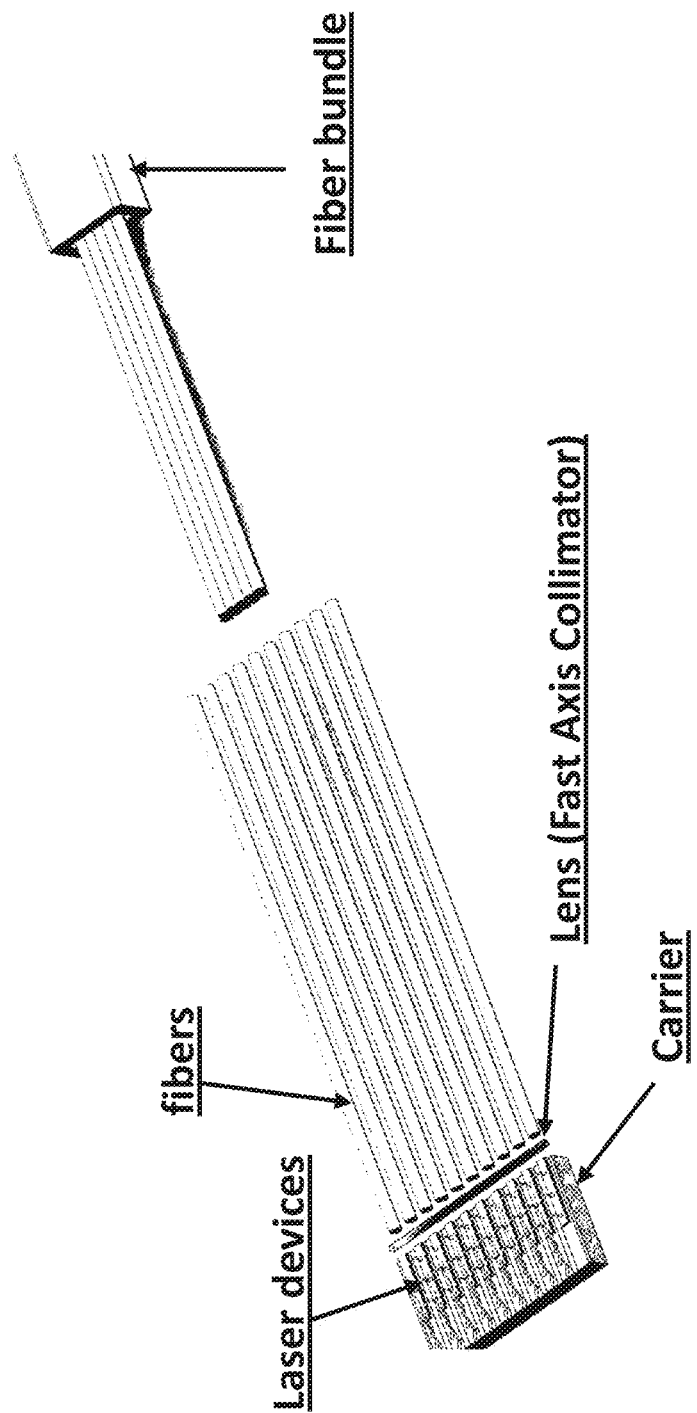
FIG. 11 is a schematic of laser module with a fiber bundle according to an example of the present invention.

FIG. 11 is an example of laser module with a fiber bundle. After collimation by the fast axis collimation (FAC) lens and fiber coupling, the fibers are bundled together at the end. In such a configuration the fiber is in the vicinity of the laser diode chip, typically within 0.5 to 10 mm.

Figure 12:
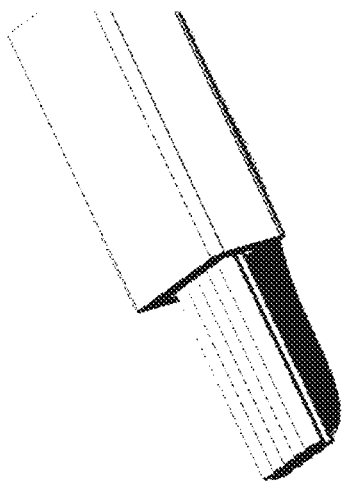
FIG. 12 is a schematic of laser module with lensed fibers according to an example of the present invention.
Figure 12:
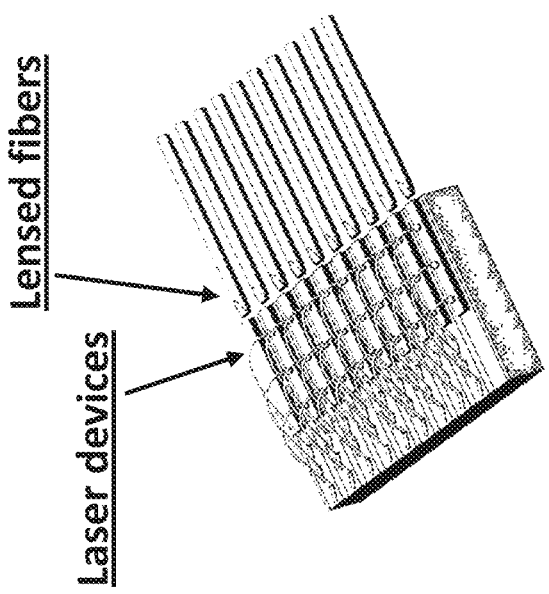

FIG. 12 is an example of laser module with lensed fibers. In this configuration lensed fibers are used for direct coupling to the laser diode without the inclusion of a fast axis collimating (FAC) lens. In such a configuration the fiber is in the vicinity of the laser diode chip, typically within 0.2 to 2 mm.

In an example, the present invention provides an alternative optical coupling technique to combine the optical outputs from the individual emitters or laser bars within the optical module. By using free-space optics to combine all of the optical outputs into one or multiple free-space laser beams first, and then coupling the free space laser beam(s) directly to the application, or to an optical fiber which would then be coupled to the application, the degradation mechanism associated with direct fiber coupling would be avoided. In this configuration the optical fiber is positioned in a remote location (10 to 100 mm) relative to the laser diode facet region. As a result, the free-space coupling optical module emitting blue or green light could possess a long lifetime for reliable operation.

Figure 13:
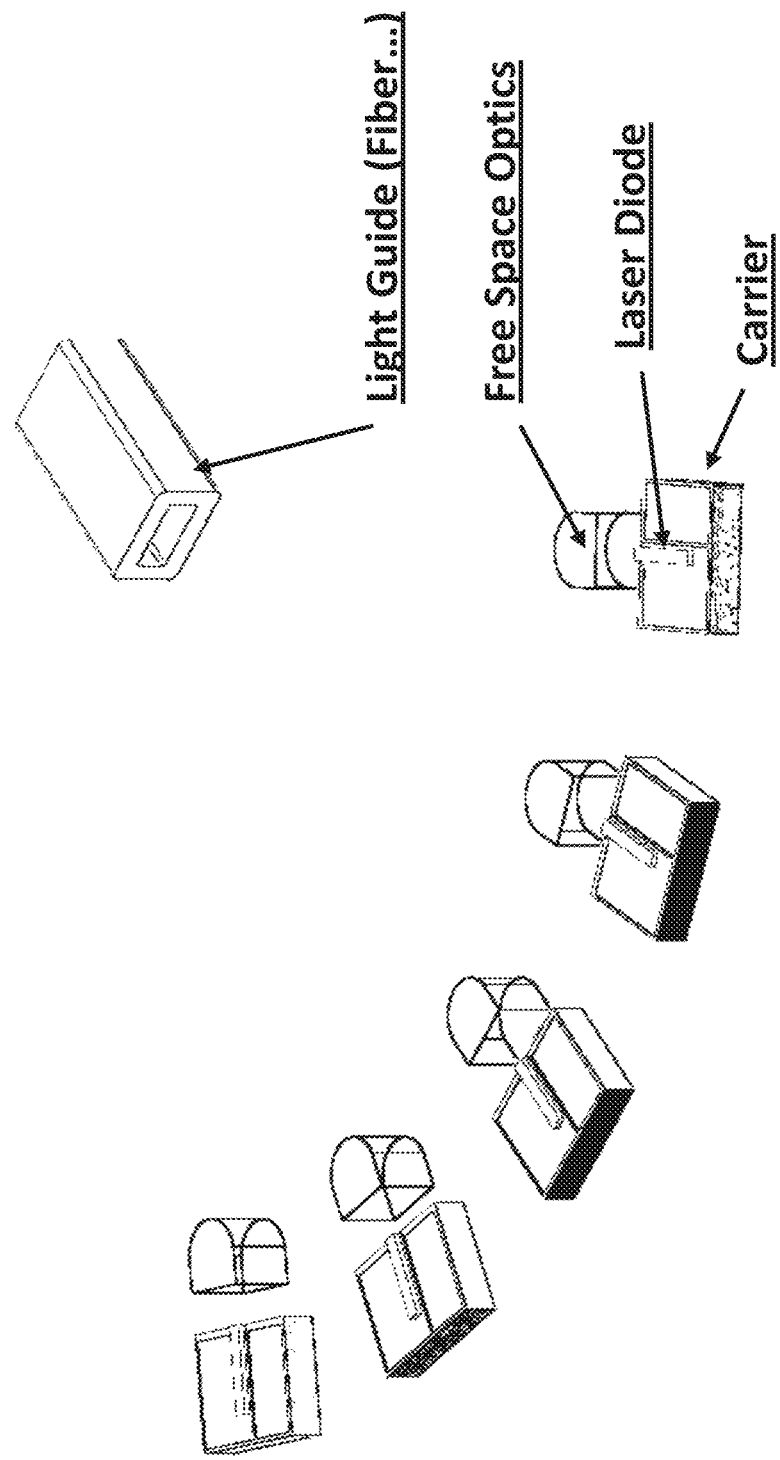
FIG. 13 is a schematic of a free space laser combiner according to an example of the present invention.

FIG. 13 is an example of a free space laser combiner. In this configuration the emitting laser beams from the well positioned laser diodes are collimated and coupled using free-space optics. The beam or multiple laser beams are then funneled into a remotely positioned light guide such as a fiber. Such a free-space configuration keeps the fiber coupling far from the laser diode chips.

Figure 14:
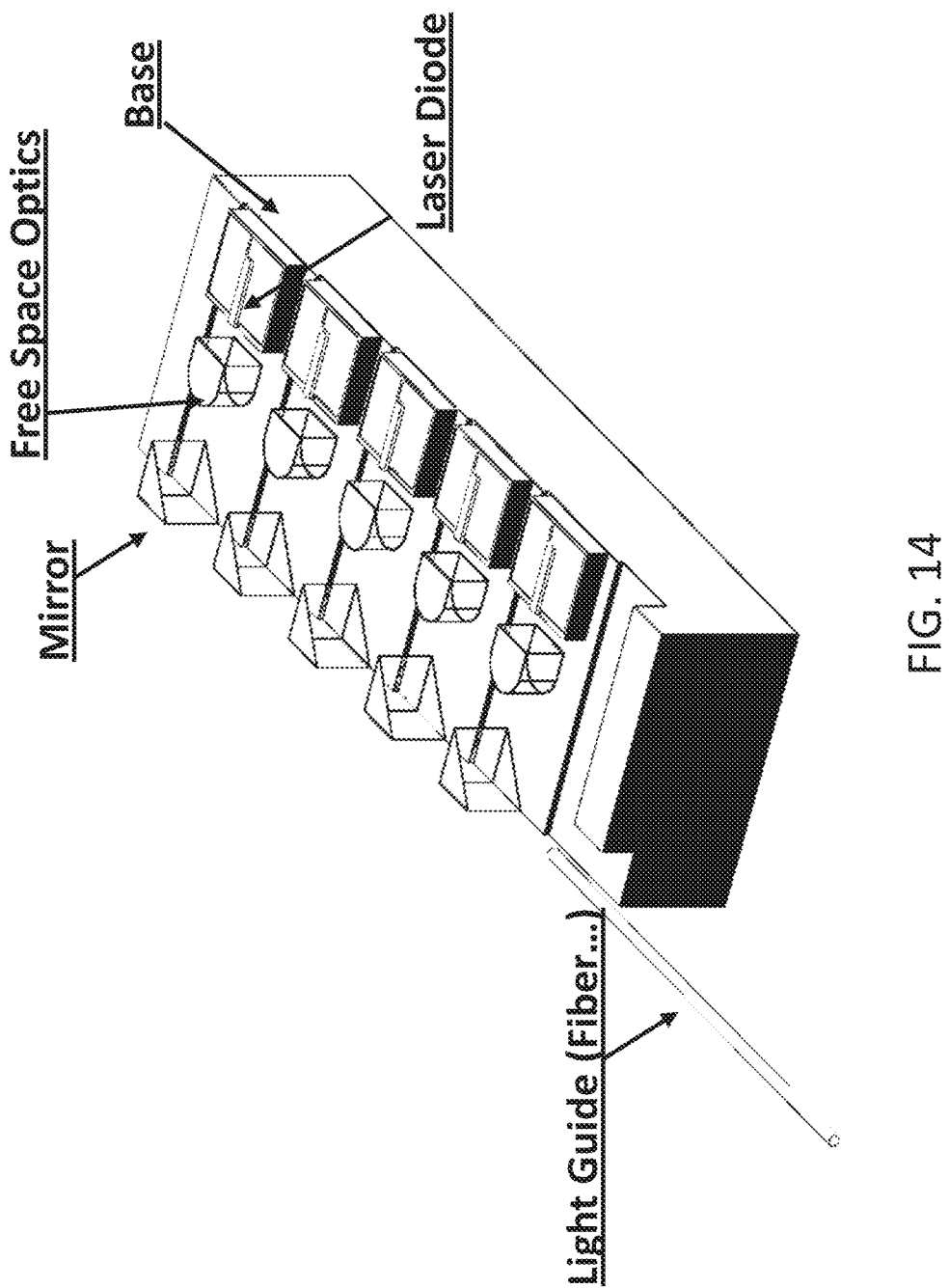
FIG. 14 is a schematic of a free space mirror based laser combiner according to an example of the present invention.

FIG. 14 is an example of a free-space mirror based laser combiner. Individual laser beams are first collimated through free-space optics such as fast axis collimating (FAC) and slow axis collimating (SAC) lenses. Next the collimated laser beams are incident on turning mirrors to change the direction of the laser beams by 90 degrees. This is done for an array of laser diode beams which are combined into one single beam and then coupled into the light guide such as a fiber.

Figure 15:
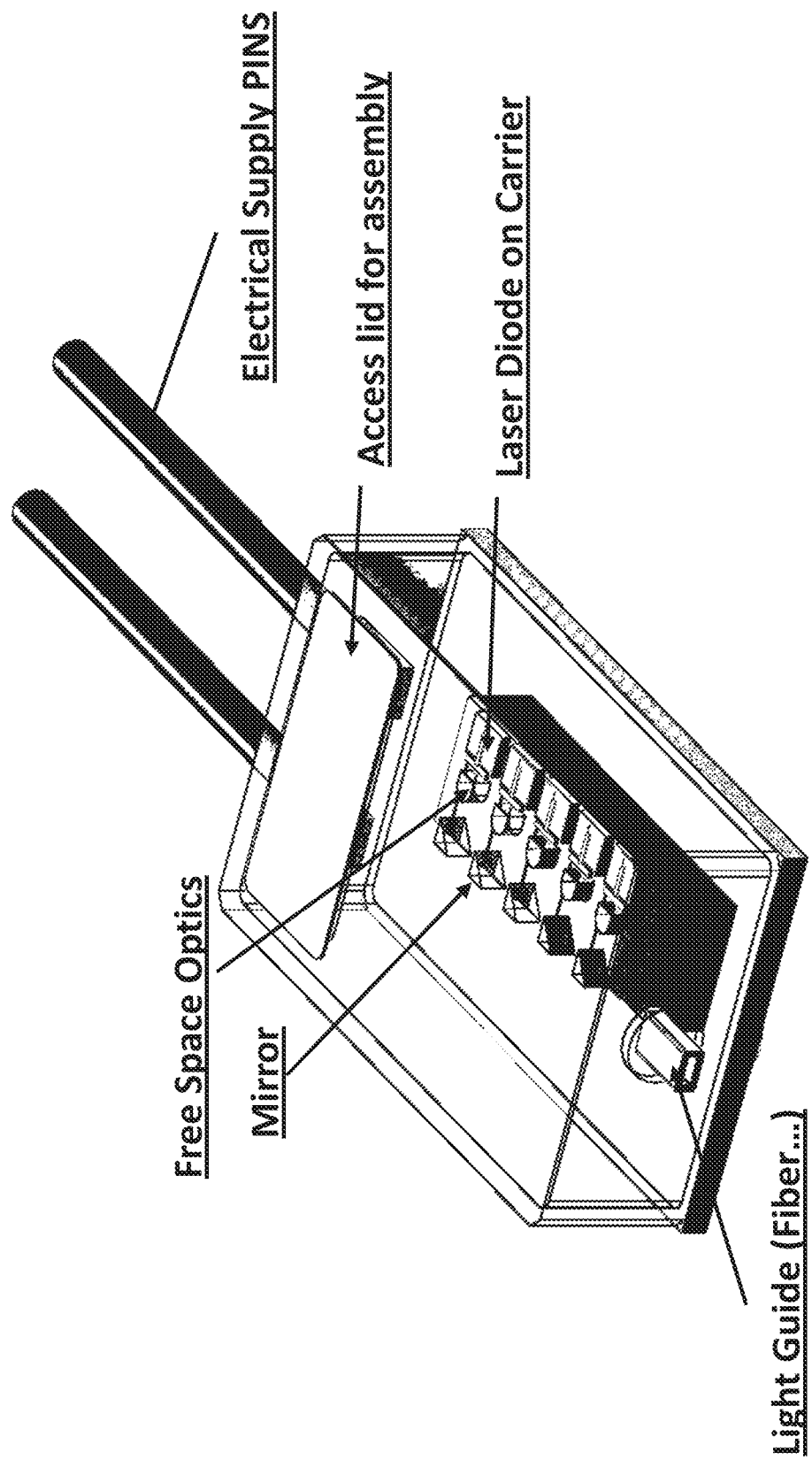
FIG. 15 is a schematic of an enclosed free space laser module according to an example of the present invention.

FIG. 15 is an example of enclosed free space laser module. A compact plug-and-play design provides a lot of flexibilities and ease of use.

Figure 16:
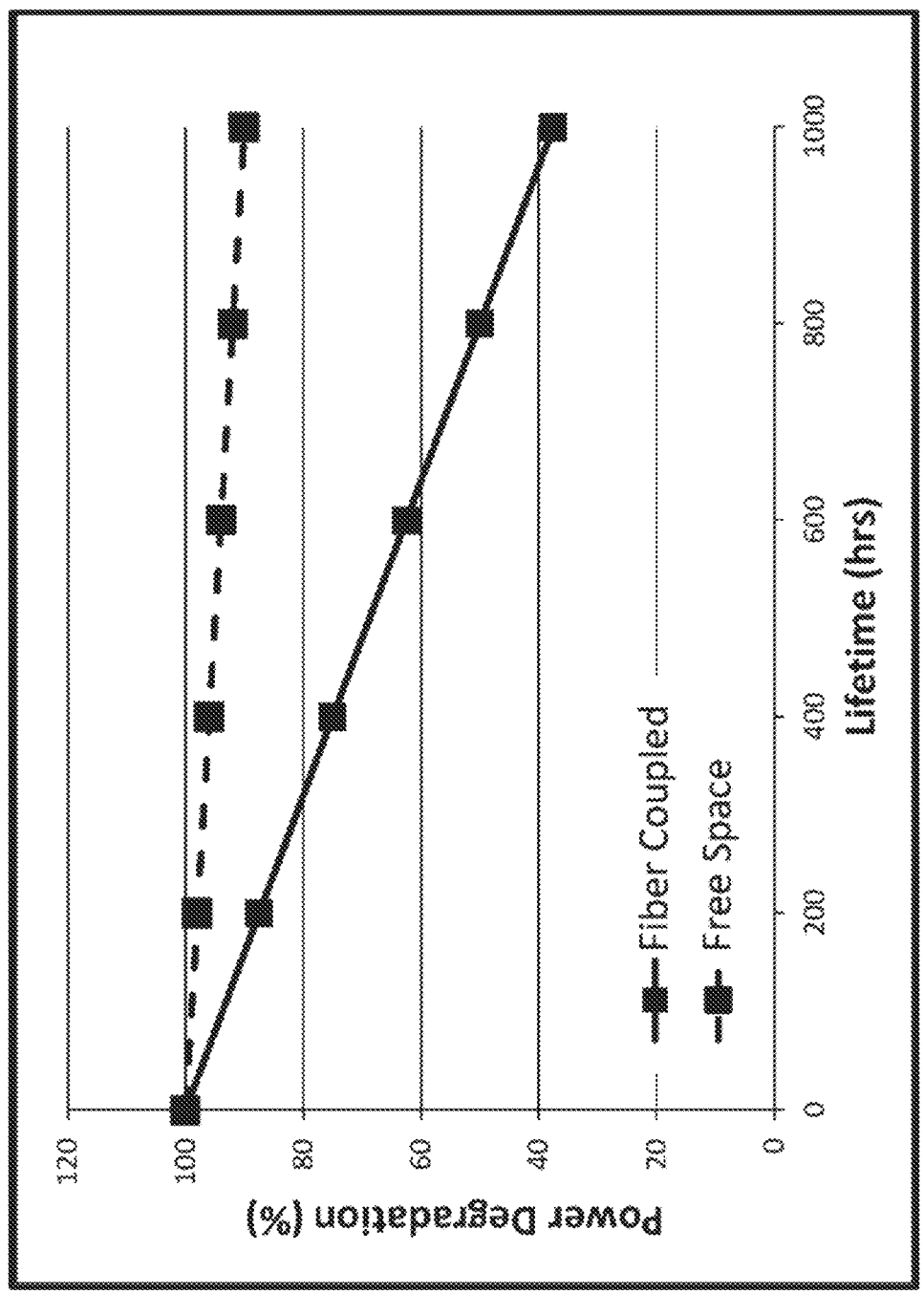
FIG. 16 is an illustration on strong lifetime dependence on laser coupling schemes according to an example of the present invention.

FIG. 16 illustrates the strong lifetime dependence on laser coupling schemes. By adopting a free-space coupling (dashed line) approach to avoid direct fiber coupling (solid line), the degradation rate is strongly suppressed to enable less than 20% degradation over 500 hrs of operation with output powers of over 5 W, over 10 W, over 30 W, or over 60 W.

Figure 17:
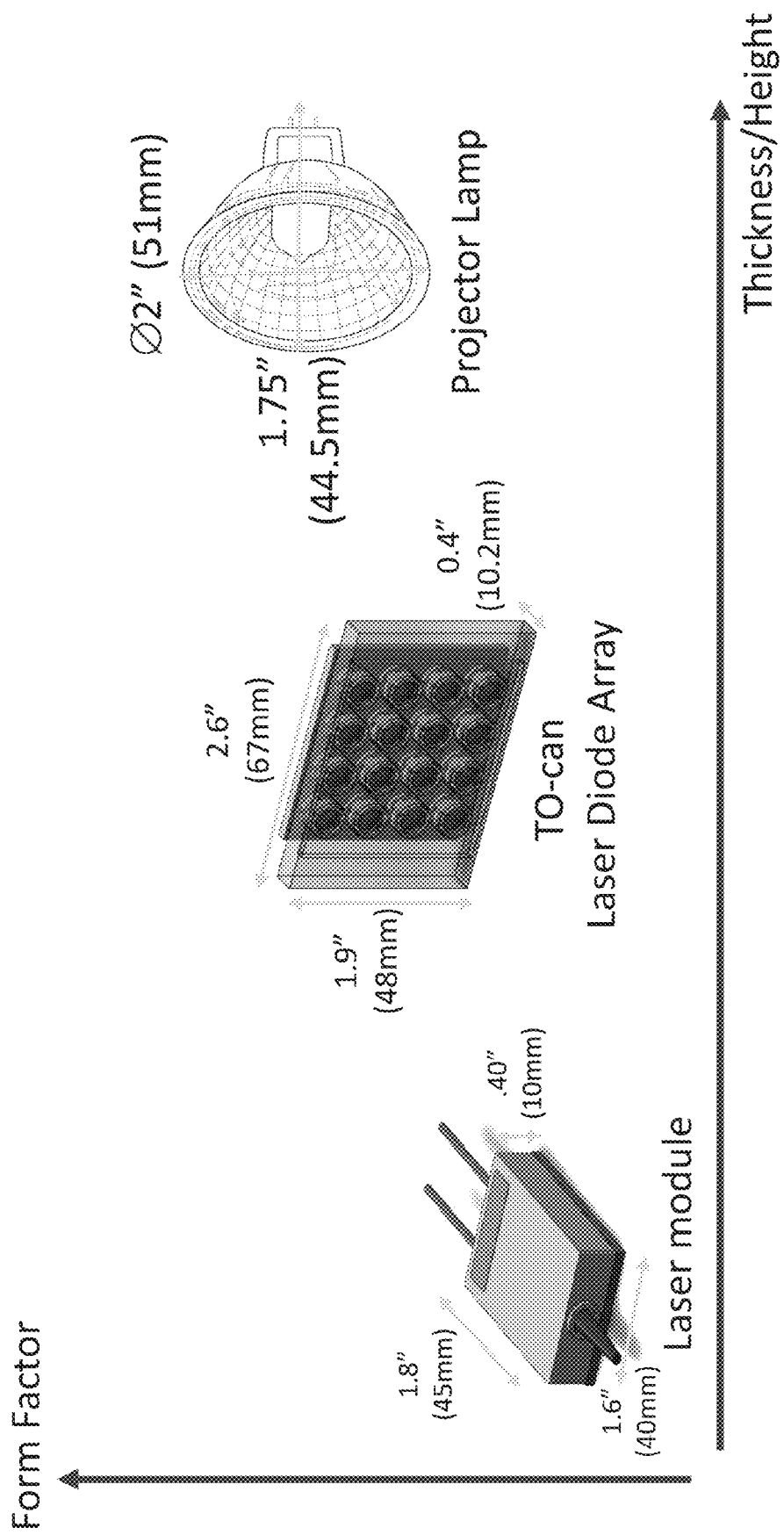
FIG. 17 is a simplified illustration of module form factor according to an embodiment of the present invention.

FIG. 17 is a simplified illustration of module form factor according to an embodiment of the present invention. As shown, the illustration is how optical modules comprised of laser diode chips can provide drastically reduced form factors and thicknesses than conventional lamp based light sources and even laser diodes based on TO-can arrays. Such reduction in thickness can enable smaller, more compact form factor CE products such as display projectors. The smaller form factor is an unexpected result of our integration. Further details of the present system can be found throughout the present specification.

In an alternative embodiment of this invention, nonpolar or semipolar GaN-based laser diodes are employed in the module. Due to the alternative facet cleavage plane in such lasers based on nonpolar/semipolar orientations, and a waveguide design possibility that does not include AlGaN cladding layers, such laser diodes could be compatible with direct fiber coupling without the rapid degradation demonstrated for conventional c-plane devices.

In an alternative embodiment, the present invention provides an optical module device combining the emissions of N laser beams, where N is greater than 1. The method of optical combining includes free-space optics to create one or more free space optical beams. The optical emission comprises a blue emission in the 415 nm to 485 nm wavelength range and/or a green emission in the 500 nm to 560 nm wavelength range. The optical module device comprised to operate with over 5 W, over 20 W, or over 50 W. The optical module device is characterized by an optical output power degradation of less than 20% in 500 hours when operated at a constant input current.

In certain embodiments, optical modules provided by the present disclosure comprise a plurality of laser diode devices numbered from 1 through N overlying the support member, each of the plurality of laser diode devices configured to emit a laser beam. The laser diode devices may include devices that emit in the violet region (390-430 nm), the blue region (430 nm to 490 nm), the green region (490 nm to 560 nm), the yellow region (560 nm to 600 nm), or in the red region (625 nm to 670 nm) of the electromagnetic spectrum. An optical module may include a combination of laser diode devices emitting in different parts of the electromagnetic spectrum In certain embodiments, the combination of laser diodes is selected to produce a combined output radiation having a desired wavelength distribution. In certain embodiments, the combined output can be a white light output. The laser diode devices may be based on different semiconductor technology such gallium and nitrogen containing devices or AlInGa although other suitable technologies may be employed. In certain embodiments, at least some of the plurality of laser diode devices comprise gallium and nitrogen containing laser diode devices configured to emit a laser beam characterized by emission selected from blue emission with a wavelength ranging from 415 nm to 485 nm, green emission with a wavelength ranging from 500 nm to 560 nm, and a combination thereof. In certain embodiments at least some of the plurality of laser diode devices comprise AlInGaP laser diode device configured to emit a laser beam characterized by red emission with a wavelength ranging from 625 nm to 670 nm.

In a specific embodiment, the package can be used in a variety of applications. The applications include power scaling (modular possibility), spectral broadening (select lasers with slight wavelength shift for broader spectral characteristics). The application can also include multicolor monolithic integration such as blue-blue, blue-green, RGB (Red-Blue-Green), and others.

In a specific embodiment, the present laser device can be configured on a variety of packages. As an example, the packages include TO9 Can, TO56 Can, flat package(s), CS-Mount, G-Mount, C-Mount, micro-channel cooled package(s), and others. In other examples, the multiple laser configuration can have an operating power of 1.5 Watts, 3, Watts, 6 Watts, 10 Watts, and greater. In an example, the present optical device, including multiple emitters, are free from any optical combiners, which lead to inefficiencies. In other examples, optical combiners may be included and configured with the multiple emitter devices. Additionally, the plurality of laser devices (i.e., emitters) may be an array of laser device configured on non-polar oriented GaN or semipolar oriented GaN or any combination of these, among others.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

In other examples, the present device is operable in an environment comprising at least 150,000 ppm oxygen gas. The laser device is substantially free from AlGaN or InAlGaN claddings. The laser device is substantially free from p-type AlGaN or p-type InAlGaN claddings. Each of the emitter comprises a front facet and a rear facet, the front facet being substantially free from coatings. Each of the emitter comprises a front facet and a rear facet, the rear facet comprising a reflective coating. In other examples, the device also has a micro-channel cooler thermally coupled to the substrate. The device also has a submount characterized by a coefficient of thermal expansion (CTE) associated with the substrate and a heat sink. The submount coupled to the substrate, the submount comprises aluminum nitride material, BeO, diamond, composite diamond, or combinations In a specific embodiment, the substrate is glued onto a submount, the submount being characterized by a heat conductivity of at least 200 W/(mk). The substrate comprises one or more cladding regions. The one or more optical members comprise a fast-axis collimation lens. The laser device is characterized by a spectral width of at least 4 nm. In a specific example, the number N of emitters can range between 3 and 15, 15 and 30, 30 and 50, and can be greater than 50. In other examples, each of the N emitters produces an average output power of 25 to 50 mW, produces an average output power of 50 to 100 mW, produces an average output power of 100 to 250 mW, produces an average output power of 250 to 500 mW, or produces an average output power of 500 to 1000 mW. In a specific example, each of the N emitters produces an average output power greater than 1 W. In an example, each of the N emitters is separated by 3 μm to 15 μm from one another or separated by 15 μm to 75 μm from one another or separated by 75 μm to 150 μm from one another or separated by 150 μm to 300 μm from one another.

In yet an alternative specific embodiment, the present invention provides an optical device, e.g., laser. The device includes a gallium and nitrogen containing material having a surface region, which is characterized by a semipolar surface orientation within 5 degrees of one of the following (10-11), (10-1-1), (20-21), (20-2-1), (30-31), (30-3-1), (40-41), or (40-4-1). The device also has a first waveguide region configured in a first direction, which is a projection of a c-direction overlying the surface region of the gallium and nitrogen containing material in a specific embodiment. The device also has a second waveguide region coupled to the first waveguide region and is configured in a second direction overlying the surface region of the gallium and nitrogen containing material. In a preferred embodiment, the second direction is different from the first direction and substantially parallel to the a-direction. In a preferred embodiment, the first and second waveguide regions are continuous, are formed as a single continuous waveguide structure, and are formed together during manufacture of the waveguides. Of course, there can be other variations, modifications, and alternatives.

In an example, the apparatus has a support member comprised of a copper material, an aluminum material, a silicon material, or combinations thereof. In an example, a microchannel cooler thermally is coupled to the support member. In an example, a heat spreader is coupled between the support member and the laser devices.

In an example, a phosphor material is provided within the module apparatus and in particular optically coupled to the laser beams. In an example, the phosphor material optically interacts with the plurality of laser beams. The phosphor material operates in a reflective mode, a transmissive mode, or combinations thereof, and the like. The phosphor material is positioned in the optical path coupled to an optical element or a metal or other material. The phosphor material is thermally coupled to the support member along a continuous thermal gradient toward a selected portion of a heat sink region within a vicinity of the support member. The apparatus also has an optical coupling of the plurality of laser beams to a phosphor material external to the module apparatus. In an example, the plurality of laser beams is guided through an optical fiber to couple to the phosphor material. The output beam is geometrically configured to optimize the interaction with the phosphors such as improving the efficiency of a phosphor conversion process. In an example, a phosphor material coupled with the plurality of laser beams and combiner to cause output of a selected spatial pattern having a maximum width and a minimum width.

In an example, the apparatus has an electrical input interface is configured to couple radio frequency electrical inputs to the plurality of laser devices. The electrical input interface is configured to couple logic signals to the plurality of laser devices.

In an example, the apparatus has a submount member characterized by a coefficient of thermal expansion (CTE) associated with the support member and a heat sink. In an example, a submount member is coupling the N laser devices to the support member. The submount member is made of a material including at least one of aluminum nitride, BeO, diamond, composite diamond, or combinations thereof. The submount members are used to couple the N laser devices to the support member. In a example, a submount is glued to the support member. In an example, the submount is characterized by a heat conductivity of at least 200 W/(mk). In an example, the laser devices are directly thermally coupled directly to the support member. In an example, at least a portion of the N laser devices are configured on either a non-polar or semipolar gallium and nitrogen containing oriented surface region.

In an example, the nonpolar or semipolar oriented surface region is a semipolar orientation characterized by the {20-21} or {20-2-1} plane. A laser stripe region overlies the semipolar surface region; wherein the laser stripe region is oriented in the projection of the c-direction. In an example, the nonpolar or semipolar oriented surface region is a nonpolar orientation characterized by m-plane and a laser stripe region overlies the nonpolar surface region; wherein the laser stripe region is oriented in the c-direction. In an example, the plurality of laser beams are individually optically coupled into a plurality of optical fibers. The plurality of the optical fibers are optically coupled with each other to combine the plurality of laser beams into at least one output beam. The output beam is coupled into an optical fiber. In an example, the output beam is characterized by a wide spectral width of at least 4 nm; wherein N ranges between 3 and 50, and the output beam is characterized by a narrow spectral width of less than 4 nm; wherein N ranges between 3 and 50. In an example, each of the N emitters produces an average output power of 10 to 1000 mW. In an example, each of the N emitters produces an average output power of 1 to 5 W. The optical module apparatus is characterized by an output power of 10 W and greater, 50 W and greater, or 100 W and greater or 200 W and greater or less, although there may be variations. In an example, a thermal impedance of less than 2 degrees Celsius per watt of electrical input power is characterizing the thermal path from the laser device to a heat sink. In an example, a thermal impedance of less than 1 Degrees Celsius per watt of electrical input power is characterizing the thermal path from the laser device to a heat sink. In an example, an optical output power degradation of less than 20% in 2000 hours is provided when the optical module apparatus is operated at a rated output power with a constant input current at a base temperature of 25 degrees Celsius. In an example, an optical output power degradation of less than 20% in 5000 hours is provided when the optical module apparatus is operated at a rated output power with a constant input current at a base temperature of 25 degrees Celsius. Depending upon the embodiment, the height is characterized by less than 7 mm or the height is characterized by less than 4 mm or the height is characterized by less than 2 mm.

In certain embodiments, an optical module apparatus comprises a form factor characterized by a length, a width, and a height; the height characterized by a dimension of less than 11 mm and greater than 1 mm, the apparatus comprising: a support member; a plurality of laser diode devices numbered from 1 through N overlying the support member, each of the plurality of laser diode devices configured to emit a laser beam; wherein at least some of the plurality of laser diode devices comprise gallium and nitrogen containing laser diode devices configured to emit a laser beam characterized by emission selected from blue emission with a wavelength ranging from 415 nm to 485 nm, green emission with a wavelength ranging from 500 nm to 560 nm, and a combination thereof; and wherein N is greater than 1; a free space with a non-guided characteristic capable of transmitting the laser beams from each of the plurality of laser diode devices; and a combiner configured to receive the laser beams from each of the plurality of gallium and nitrogen containing laser diode devices, and to provide an output beam characterized by a selected wavelength range, a selected spectral width, a selected power, and a selected spatial configuration, wherein: the support member is configured to transport thermal energy from the plurality of laser diode devices to a heat sink; the combiner comprises free-space optics configured to create one or more free space optical beams; at least one of the laser beams is characterized by a polarization purity of greater than 60% and less than 100%; the output beam is characterized by an operating optical output power of at least 5 W; a thermal path from the plurality of laser diode devices to the heat sink characterized by a thermal impedance of less than 4 degrees Celsius per electrical watt of electrical input power characterizing; and the optical module apparatus is characterized by an optical output power degradation of less than 20% in 500 hours when the optical module apparatus is operated within the optical output power with a constant input current at a base temperature of 25 degrees Celsius.

In certain embodiments of an optical module apparatus, at least some of the plurality of laser diode devices comprise AlInGaP laser diode device configured to emit a laser beam characterized by red emission with a wavelength ranging from 625 nm to 665 nm.

In certain embodiments, an optical module apparatus further comprises an electrical input interface configured to couple electrical input power to each of the plurality of laser diode devices.

In certain embodiments of an optical module apparatus, the output power is from 5 W to 200 W.

In certain embodiments of an optical module apparatus, each of the plurality of laser diode devices is operable in an environment comprising at least 150,000 ppm oxygen gas; wherein each of the plurality of laser diode devices is substantially free from efficiency degradation over a time period from the oxygen gas.

In certain embodiments of an optical module apparatus, the support member comprises a material selected from copper, aluminum, silicon, and a combination of any of the foregoing.

In certain embodiments, an optical module apparatus further comprises a micro-channel cooler thermally coupled to the support member.

In certain embodiments, an optical module apparatus further comprises a heat spreader coupled between the support member and the plurality of laser devices.

In certain embodiments, an optical module apparatus further comprises a phosphor material optically coupled to the output beam.

In certain embodiments of an optical module apparatus, a phosphor material is configured to operate in a mode selected from a reflective mode, a transmissive mode, and a combination of a reflective mode and a transmissive mode.

In certain embodiments of an optical module apparatus, a phosphor material is coupled to an optical element or to a metal.

In certain embodiments of an optical module apparatus, a phosphor material is thermally coupled to the support member along a continuous thermal gradient toward a selected portion of a heat sink region within a vicinity of the support member.

In certain embodiments, an optical module apparatus further comprises an optical coupler configured to optically couple the plurality of laser beams to a phosphor material external to the module apparatus.

In certain embodiments of an optical module apparatus, an optical coupler comprises one or more optical fibers.

In certain embodiments of an optical module apparatus, the output beam is geometrically configured to optimize an interaction with a phosphor material from a first efficiency to a second efficiency.

In certain embodiments, an optical module apparatus further comprises a phosphor material coupled with the laser beams; and wherein the combiner is configured to provide an output beam characterized by a selected spatial pattern having a maximum width and a minimum width.

In certain embodiments of an optical module apparatus, an electrical input interface is configured to couple radio frequency electrical inputs to the plurality of laser diode devices.

In certain embodiments of an optical module apparatus, an electrical input interface is configured to couple logic signals to the plurality of laser diode devices.

In certain embodiments, an optical module apparatus further comprises a submount member characterized by a coefficient of thermal expansion (CTE) coupled to the support member and the heat sink.

In certain embodiments, an optical module apparatus further comprises one or more submount members coupling the plurality of laser diode devices to the support member.

In certain embodiments of an optical module apparatus, the one or more submount member comprises a material selected from aluminum nitride, BeO, diamond, composite diamond, and a combination of any of the foregoing.

In certain embodiments of an optical module apparatus, the one or more submount members is configured to couple the plurality of laser diode devices to the support member.

In certain embodiments, an optical module apparatus further comprises a submount attached to the support member, the submount being characterized by a thermal conductivity of at least 200 W/(mk).

In certain embodiments of an optical module apparatus, the plurality of laser diode devices are directly thermally coupled directly to the support member.

In certain embodiments of an optical module apparatus, at least a portion of the plurality of laser diode devices is overlies an orient surface region selected from a non-polar gallium and nitrogen containing oriented surface region and a semi-polar gallium and nitrogen containing oriented surface region.

In certain embodiments of an optical module apparatus, an oriented surface region is a semipolar orientation characterized by the {20-21} or {20-2-1} plane; and a laser stripe region overlies the oriented surface region; wherein the laser stripe region is oriented in the projection of the c-direction.

In certain embodiments of an optical module apparatus, an oriented surface region is a nonpolar orientation characterized by the m-plane; and a laser stripe region overlies the oriented surface region, wherein the laser stripe region is oriented in the c-direction.

In certain embodiments of an optical module apparatus, free space optics comprises a fast-axis collimation lens.

In certain embodiments, an optical module apparatus further comprises an optical fiber, wherein the output beam is coupled into the optical fiber.

In certain embodiments of an optical module apparatus, an output beam is characterized by a spectral width of at least 4 nm; and N ranges from 3 to 50.

In certain embodiments of an optical module apparatus, an output beam is characterized by a spectral width of less than 4 nm; and N ranges from 3 to 50.

In certain embodiments of an optical module apparatus, each of the plurality of laser diode devices emits a laser beam characterized by an average output power from 10 mW to 1000 mW.

In certain embodiments of an optical module apparatus, each of the plurality of laser diode devices emits a laser beam characterized by an average output power from 1 W to 5 W.

In certain embodiments of an optical module apparatus, an output power is selected from 10 W and greater, 50 W and greater, and 100 W and greater.

In certain embodiments of an optical module apparatus, a thermal impedance is less than 2 degrees Celsius per watt of electrical input power.

In certain embodiments of an optical module apparatus, a thermal impedance is less than 1 degrees Celsius per watt of electrical input power.

In certain embodiments of an optical module apparatus, the optical output power degradation is less than 20% in 2,000 hours when the optical module apparatus is operated within the output power with a constant input current at a base temperature of 25 degrees Celsius.

In certain embodiments of an optical module apparatus, the optical output power degradation is less than 20% in 5,000 hours when the optical module apparatus is operated at within the output power with a constant input current at a base temperature of 25 degrees Celsius.

In certain embodiments, an optical module apparatus comprising a form factor characterized by a length, a width, and a height; the height characterized by a dimension of less than 11 mm and greater than 1 mm, the apparatus comprising: a support member; a plurality of laser diode devices numbered from 1 through N overlying the support member, each of the plurality of laser diode devices configured to emit a laser beam; wherein at least some of the plurality of laser diode devices comprise gallium and nitrogen containing laser diode devices configured to emit a laser beam characterized by emission selected from blue emission with a wavelength ranging from 415 nm to 485 nm, green emission with a wavelength ranging from 500 nm to 560 nm, and a combination thereof; and wherein N is greater than 1; a waveguiding member configured to transmit the laser beams from the plurality of laser optical devices; and a combiner configured to receive laser beams from the plurality of laser diode devices; and to provide an output beam characterized by a selected wavelength range, a selected spectral width, a selected power, and a selected spatial configuration; wherein the support member is configured to transport thermal energy from the plurality of laser diode devices to a heat sink; at least one of the laser beams is characterized by a polarization purity of greater than 60% and less than 100%; the output beam is characterized by an optical output power of at least 5 W; and a thermal path from the laser device to a heat sink is characterized by a thermal impedance of less than 4 degrees Celsius per electrical watt of input power.

In certain embodiments, an optical module apparatus comprising a form factor characterized by a length, a width, and a height; the height characterized by a dimension less than 11 mm and greater than 1 mm, the apparatus comprising: a support member; a plurality of laser diode devices numbered from 1 through N overlying the support member, each of the plurality of laser diode devices configured to emit a laser beam; wherein at least some of the plurality of laser diode devices comprising gallium and nitrogen containing laser diode devices characterized by a nonpolar or semipolar oriented surface region and configured to emit a laser beam characterized by emission selected from blue emission with a wavelength ranging from 415 nm to 485 nm, green emission with a wavelength ranging from 500 nm to 560 nm, and a combination thereof; and wherein N is greater than 1; a laser stripe region overlying the nonpolar or semipolar surface region; wherein each laser stripe region is oriented in a c-direction or a projection of a c-direction and characterized by a first end and a second end; and a combiner configured to receive a plurality of laser beams of N incoming laser beams; the combiner functioning to cause an output beam with a selected wavelength range, spectral width, power, and spatial configuration, where N is greater than 1; wherein the support member is configured to transport thermal energy from the plurality of laser diode devices to a heat sink; at least one of the laser beams is characterized by a polarization purity of greater than 60% and less than 100%; the output beam is characterized by a predetermined rated operating optical output power range of at least 5 W; and a thermal path from the laser device to a heat sink is characterized by a thermal impedance of less than 4 degrees Celsius per electrical watt of input power.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical module apparatus comprising a form factor characterized by a length, a width, and a height; the height characterized by a dimension of less than 11 mm and greater than 1 mm, the apparatus comprising:
a support member;
a plurality of laser diode devices numbered from 1 through N overlying the support member, each of the plurality of laser diode devices configured to emit a laser beam; wherein at least some of the plurality of laser diode devices comprise gallium and nitrogen containing laser diode devices configured to emit a laser beam characterized by emission selected from blue emission with a wavelength ranging from 415 nm to 485 nm, green emission with a wavelength ranging from 500 nm to 560 nm, and a combination thereof; and wherein N is greater than 1;
a free space with a non-guided characteristic capable of transmitting the laser beams from each of the plurality of laser diode devices;
a combiner configured to receive the laser beams from each of the plurality of gallium and nitrogen containing laser diode devices, and to provide an output beam characterized by a selected wavelength range, a selected spectral width, a selected power, and a selected spatial configuration; and
a phosphor material optically coupled to the output beam, wherein:
the support member is configured to transport thermal energy from the plurality of laser diode devices to a heat sink;
the combiner comprises free-space optics configured to create one or more free space optical beams;
at least one of the laser beams is characterized by a polarization purity of greater than 60% and less than 100%;
the output beam is characterized by an operating optical output power of at least 5 W;
a thermal path from the plurality of laser diode devices to the heat sink characterized by a thermal impedance of less than 4 degrees Celsius per electrical watt of electrical input power characterizing; and
the optical module apparatus is characterized by an optical output power degradation of less than 20% in 500 hours when the optical module apparatus is operated within the optical output power with a constant input current at a base temperature of 25 degrees Celsius.

2. The apparatus of claim 1, wherein at least some of the plurality of laser diode devices comprise AlInGaP laser diode device configured to emit a laser beam characterized by red emission with a wavelength ranging from 625 nm to 665 nm.

3. The apparatus of claim 1, further comprising an electrical input interface configured to couple electrical input power to each of the plurality of laser diode devices.

4. The apparatus of claim 1, wherein the output power is from 5 W to 200 W.

5. The apparatus of claim 1, wherein each of the plurality of laser diode devices is operable in an environment comprising at least 150,000 ppm oxygen gas; wherein each of the plurality of laser diode devices is substantially free from efficiency degradation over a time period from the oxygen gas.

6. The apparatus of claim 1 wherein the support member comprises a material selected from copper, aluminum, silicon, and a combination of any of the foregoing.

7. The apparatus of claim 1, further comprising a microchannel cooler thermally coupled to the support member.

8. The apparatus of claim 1, further comprising a heat spreader coupled between the support member and the plurality of laser devices.

9. The apparatus of claim 1 wherein the phosphor material is configured to operate in a mode selected from a reflective mode, a transmissive mode, and a combination of a reflective mode and a transmissive mode.

10. The apparatus of claim 1, wherein the phosphor material is coupled to an optical element or to a metal.

11. The apparatus of claim 1, wherein the phosphor material is thermally coupled to the support member along a continuous thermal gradient toward a selected portion of a heat sink region within a vicinity of the support member.

12. The apparatus of claim 1, further comprising an optical coupler configured to optically couple the plurality of laser beams to the phosphor material external to the module apparatus.

13. The apparatus of claim 12, wherein the optical coupler comprises one or more optical fibers.

14. The apparatus of claim 1, wherein the output beam is geometrically configured to optimize an interaction with the phosphor material from a first efficiency to a second efficiency.

15. The apparatus of claim 1, further comprising
wherein the combiner is configured to provide the output beam characterized by a selected spatial pattern having a maximum width and a minimum width.

16. The apparatus of claim 3, wherein the electrical input interface is configured to couple radio frequency electrical inputs to the plurality of laser diode devices.

17. The apparatus of claim 3, wherein the electrical input interface is configured to couple logic signals to the plurality of laser diode devices.

18. The apparatus of claim 1, further comprising a submount member characterized by a coefficient of thermal expansion (CTE) coupled to the support member and the heat sink.

19. The apparatus of claim 1, further comprising one or more submount members coupling the plurality of laser diode devices to the support member.

20. The apparatus of claim 19, wherein the one or more submount member comprises a material selected from aluminum nitride, BeO, diamond, composite diamond, and a combination of any of the foregoing.

21. The apparatus of claim 19, wherein the one or more submount members is configured to couple the plurality of laser diode devices to the support member.

22. The apparatus of claim 1, further comprising a submount attached to the support member, the submount being characterized by a thermal conductivity of at least 200 W/(mk).

23. The apparatus of claim 1, wherein the plurality of laser diode devices are directly thermally coupled directly to the support member.

24. The apparatus of claim 1, wherein at least a portion of the plurality of laser diode devices is overlies an oriented surface region selected from a non-polar gallium and nitrogen containing oriented surface region and a semipolar gallium and nitrogen containing oriented surface region.

25. The apparatus of claim 24, wherein
the oriented surface region is a semipolar orientation characterized by the {20-21} or {20-2-1} plane; and
a laser stripe region overlies the oriented surface region; wherein the laser stripe region is oriented in the projection of the c-direction.

26. The apparatus of claim 24, wherein
the oriented surface region is a nonpolar orientation characterized by the m-plane; and
a laser stripe region overlies the oriented surface region, wherein the laser stripe region is oriented in the c-direction.

27. The apparatus of claim 1, wherein the free space optics comprises a fast-axis collimation lens.

28. The apparatus of claim 1, further comprising an optical fiber, wherein the output beam is coupled into the optical fiber.

29. The apparatus of claim 1, wherein the output beam is characterized by a spectral width of at least 4 nm; and N ranges from 3 to 50.

30. The apparatus of claim 1, wherein the output beam is characterized by a spectral width of less than 4 nm; and N ranges from 3 to 50.

31. The apparatus of claim 1, wherein each of the plurality of laser diode devices emits a laser beam characterized by an average output power from 10 mW to 1000 mW.

32. The apparatus of claim 1, wherein each of the plurality of laser diode devices emits a laser beam characterized by an average output power from 1 W to 5 W.

33. The apparatus of claim 1, wherein the output power is selected from 10 W and greater, 50 W and greater, and 100 W and greater.

34. The apparatus of claim 1, wherein the thermal impedance is less than 2 degrees Celsius per watt of electrical input power.

35. The apparatus of claim 1, wherein the thermal impedance is less than 1 degrees Celsius per watt of electrical input power.

36. The apparatus of claim 1, wherein the optical output power degradation is less than 20% in 2,000 hours when the optical module apparatus is operated within the output power with a constant input current at a base temperature of 25 degrees Celsius.

37. The apparatus of claim 1, wherein the optical output power degradation is less than 20% in 5,000 hours when the optical module apparatus is operated at within the output power with a constant input current at a base temperature of 25 degrees Celsius.

38. An optical module apparatus comprising a form factor characterized by a length, a width, and a height; the height characterized by a dimension of less than 11 mm and greater than 1 mm, the apparatus comprising:
a support member;
a plurality of laser diode devices numbered from 1 through N overlying the support member, each of the plurality of laser diode devices configured to emit a laser beam; wherein
at least some of the plurality of laser diode devices comprise gallium and nitrogen containing laser diode devices configured to emit a laser beam characterized by emission selected from blue emission with a wavelength ranging from 415 nm to 485 nm, green emission with a wavelength ranging from 500 nm to 560 nm, and a combination thereof; and wherein N is greater than 1;
a waveguiding member configured to transmit the laser beams from the plurality of laser optical devices;
a combiner configured to receive laser beams from the plurality of laser diode devices; and to provide an output beam characterized by a selected wavelength range, a selected spectral width, a selected power, and a selected spatial configuration; and a phosphor material optically coupled to the output beam, wherein the support member is configured to transport thermal energy from the plurality of laser diode devices to a heat sink;

at least one of the laser beams is characterized by a polarization purity of greater than 60% and less than 100%;

the output beam is characterized by an optical output power of at least 5 W; and a thermal path from the laser device to a heat sink is characterized by a thermal impedance of less than 4 degrees Celsius per electrical watt of input power.

39. The apparatus of claim 38, further comprising an electrical input interface configured to couple electrical power to the plurality of laser diode devices.

40. The apparatus of claim 38, wherein at least some of the plurality of laser diode devices comprise AlInGaP laser diode device configured to emit a laser beam characterized by red emission with a wavelength ranging from 625 nm to 670 nm.

41. An optical module apparatus comprising a form factor characterized by a length, a width, and a height; the height characterized by a dimension less than 11 mm and greater than 1 mm, the apparatus comprising:

a support member;

a plurality of laser diode devices numbered from 1 through N overlying the support member, each of the plurality of laser diode devices configured to emit a laser beam; wherein at least some of the plurality of laser diode devices comprising gallium and nitrogen containing laser diode devices characterized by a nonpolar or semipolar oriented surface region and configured to emit a laser beam characterized by emission selected from blue emission with a wavelength ranging from 415 nm to 485 nm, green emission with a wavelength ranging from 500 nm to 560 nm, and a combination thereof; and wherein N is greater than 1;

a laser stripe region overlying the nonpolar or semipolar surface region; wherein each laser stripe region is oriented in a c-direction or a projection of a c-direction and characterized by a first end and a second end;

a combiner configured to receive a plurality of laser beams of N incoming laser beams; the combiner functioning to cause an output beam with a selected wavelength range, spectral width, power, and spatial configuration, where N is greater than 1; and a phosphor material optically coupled to the output beam, wherein the support member is configured to transport thermal energy from the plurality of laser diode devices to a heat sink;

at least one of the laser beams is characterized by a polarization purity of greater than 60% and less than 100%;

the output beam is characterized by a predetermined rated operating optical output power range of at least 5 W; and a thermal path from the laser device to a heat sink is characterized by a thermal impedance of less than 4 degrees Celsius per electrical watt of input power.

42. The apparatus of claim 41, further comprising an electrical input interface configured to couple electrical power to the plurality of laser diode devices.

43. The apparatus of claim 41, wherein at least some of the plurality of laser diode devices comprise AlInGaP laser diode device configured to emit a laser beam characterized by red emission with a wavelength ranging from 625 nm to 670 nm.

* * * * *